(12) United States Patent
Cho et al.

(10) Patent No.: US 12,349,564 B2
(45) Date of Patent: Jul. 1, 2025

(54) DISPLAY DEVICE

(71) Applicant: Samsung Display Co., Ltd., Yongin-Si (KR)

(72) Inventors: Seung Hwan Cho, Yongin-si (KR); Won Suk Choi, Seoul (KR); Ji Ryun Park, Cheonan-si (KR); Seok Je Seong, Seongnam-si (KR); Hyeon Woo Shin, Suwon-si (KR); Ji Seon Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 678 days.

(21) Appl. No.: 17/559,105

(22) Filed: Dec. 22, 2021

(65) Prior Publication Data

US 2022/0199750 A1    Jun. 23, 2022

(30) Foreign Application Priority Data

Dec. 23, 2020   (KR) .................. 10-2020-0181772

(51) Int. Cl.
  *H10K 59/131*    (2023.01)
  *G09G 3/3275*    (2016.01)
(52) U.S. Cl.
  CPC ......... *H10K 59/131* (2023.02); *G09G 3/3275* (2013.01); *G09G 2310/0297* (2013.01); *G09G 2380/02* (2013.01)
(58) Field of Classification Search
  CPC .............. H10K 59/131; H10K 59/12; H10K 2102/311; G09G 3/3275; G09G 2310/0297; G09G 2380/02; G09G 3/035; G09G 2300/0426; G09G 3/3241; G09G 3/3233; G09G 3/3225

USPC .......................................... 345/204
See application file for complete search history.

(56) References Cited

U.S. PATENT DOCUMENTS

2020/0258969 A1 *  8/2020  Yi ................. G06F 3/0443
2022/0059635 A1 *  2/2022  Liu .............. H10K 59/1213

FOREIGN PATENT DOCUMENTS

| KR | 10-2016-0075954 A | 6/2016 |
| KR | 10-2020-0009634 A | 1/2020 |
| KR | 10-2020-0010697 A | 1/2020 |
| KR | 10-2086644 B1 | 3/2020 |

\* cited by examiner

*Primary Examiner* — Chanh D Nguyen
*Assistant Examiner* — Gloryvid Figueroa-Gibson
(74) *Attorney, Agent, or Firm* — Innovation Counsel LLP

(57) ABSTRACT

A display device having a display area including a plurality of pixels arranged along a first direction and a second direction, and a non-display area located around the display area, the non-display area including a first peripheral area surrounding the display area, a second peripheral area located at a lower side of the first peripheral area, and a bending area located between the first and second peripheral areas, the display device comprises a base substrate; a multiplexer circuit unit in the second peripheral area on the base substrate, the multiplexer circuit unit being spaced apart from the display area with the bending area interposed therebetween; spider lines connected to the multiplexer circuit unit and the plurality of pixels; data lines connected to the pixel disposed in the display area on the base substrate and extending along the second direction; and connection lines connecting the data line to the spider line.

20 Claims, 17 Drawing Sheets

DISPLAY DEVICE

CROSS-REFERENCE TO RELATED APPLICATION

This application claims priority from Korean Patent Application No. 10-2020-0181772 filed on Dec. 23, 2020 in the Korean Intellectual Property Office, and all the benefits accruing therefrom under 35 U.S.C. 119, the contents of which in its entirety are herein incorporated by reference.

BACKGROUND

1. Technical Field

The present disclosure generally relates to a display device. More particularly, the present disclosure relates to a display device in which a peripheral area that is a non-display area is reduced.

2. Description of the Related Art

Recently, due to the development of technology, display products that are smaller and lighter and have better performance have been produced. A cathode ray tube (CRT) having many advantages in terms of performance and cost has been widely used as a conventional display device. However, a display device (e.g., a plasma display device, a liquid crystal display device, an organic light emitting display device, or the like) that has solved the drawbacks of the CRT in terms of miniaturization and portability and has advantages such as miniaturization, weight reduction, low power consumption or the like attracts attention.

The display device includes a display area where an image is displayed and a peripheral area that is a non-display area disposed around the display area. Here, efforts have been made to reduce the width of the peripheral area.

SUMMARY

Aspects of the present disclosure provide a display device in which a peripheral area that is a non-display area is reduced.

However, aspects of the present disclosure are not restricted to the oneset forth herein. The above and other aspects of the present disclosure will become more apparent to one of ordinary skill in the art to which the present disclosure pertains by referencing the detailed description of the present disclosure given below.

According to an embodiment, a display device having a display area including a plurality of pixels arranged along a first direction and a second direction crossing the first direction, and a non-display area located around the display area, the non-display area including a first peripheral area surrounding the display area, a second peripheral area located at a lower side of the first peripheral area, and a bending area located between the first and second peripheral areas, the display device comprises a base substrate; a multiplexer circuit unit disposed in the second peripheral area on the base substrate, the multiplexer circuit unit being spaced apart from the display area with respect to the bending area interposed therebetween; a plurality of spider lines connected to the multiplexer circuit unit and the plurality of pixels; a plurality of data lines connected to the pixel disposed in the display area on the base substrate and extending along the second direction; and a plurality of connection lines connecting each of the data lines to each of the corresponding spider lines.

According to another embodiment, a display device having a display area including a plurality of pixels and a non-display area located around the display area, the non-display area including a first peripheral area surrounding the display area, a second peripheral area located at a lower side of the first peripheral area, and a bending area located between the first and second peripheral areas, the display device comprising: a base substrate; and a multiplexer circuit unit disposed in the second peripheral area on the base substrate, wherein the multiplexer circuit unit is spaced apart from the display area with respect to the bending area interposed therebetween, a plurality of spider lines connected to the multiplexer circuit unit and the plurality of pixels, the multiplexer circuit unit includes a plurality of multiplexer circuits, the plurality of multiplexer circuits include a first multiplexer circuit and a second multiplexer circuit, the plurality of spider lines include a 1a spider line and a 1b spider line connected to the first multiplexer circuit, and a 2a spider line and a 2b spider line connected to the second multiplexer circuit, and the 1b spider line and the 2a spider line intersect in a plan view and are insulated from each other.

In accordance with one embodiment, it is possible to provide a display device in which a peripheral area that is a non-display area is reduced.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION OF THE EMBODIMENTS

Figure 1:
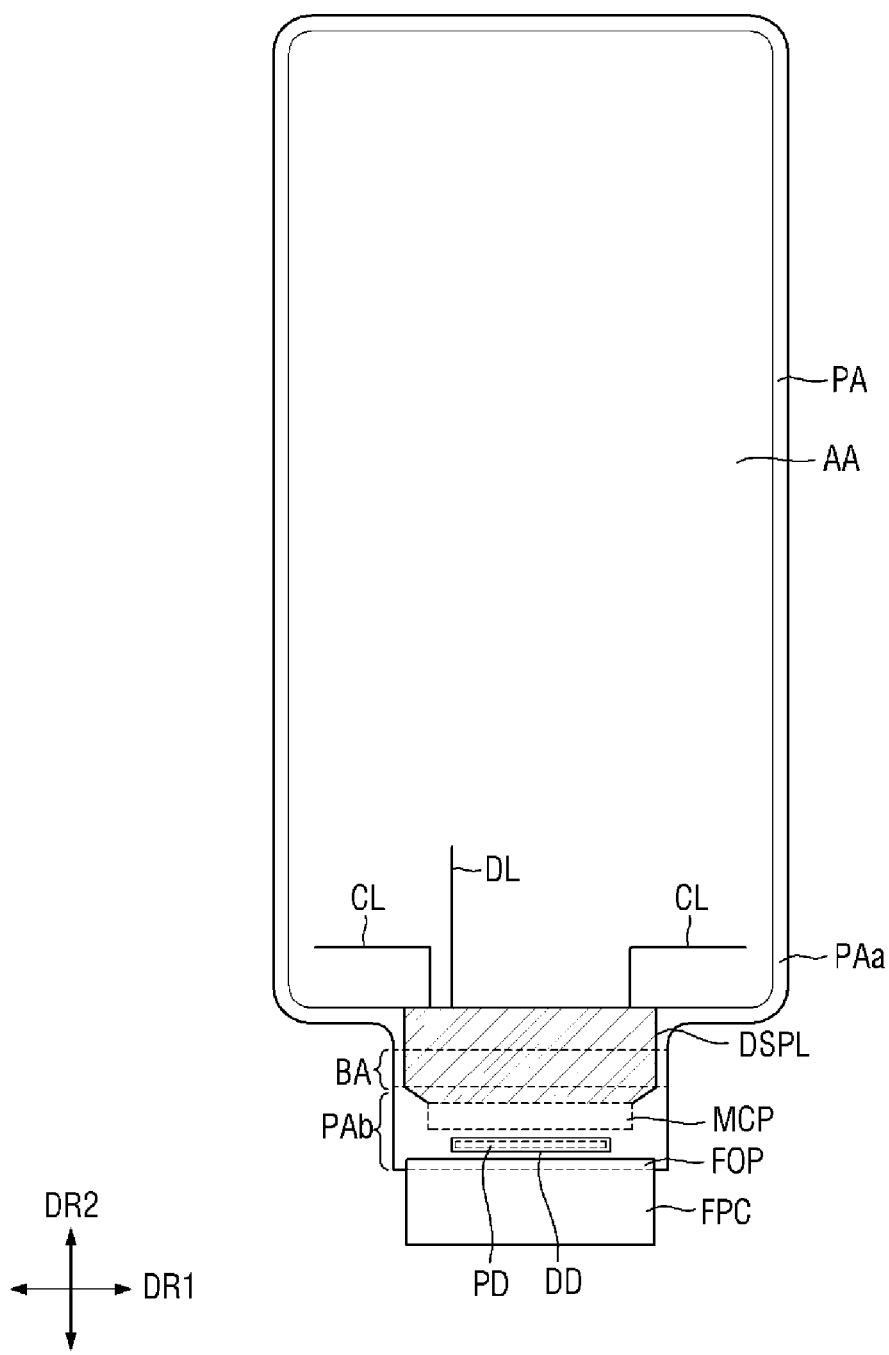
FIG. 1 is a plan view of a display device according to one embodiment.

Specific structural and functional descriptions of embodiments of the disclosure disclosed herein are only for illustrative purposes of the embodiments of the disclosure. The disclosure may be embodied in many different forms without departing from the spirit and significant characteristics of the disclosure. Therefore, the embodiments of the disclosure are disclosed only for illustrative purposes and should not be construed as limiting the disclosure. That is, the disclosure is only defined by the scope of the claims.

It will be understood that when an element is referred to as being related to another element such as being "coupled" or "connected" to another element, it can be directly coupled or connected to the other element or intervening elements may be present therebetween. In contrast, it should be understood that when an element is referred to as being related to another element such as being "directly coupled" or "directly connected" to another element, there are no intervening elements present. Other expressions that explain the relationship between elements, such as "between," "directly between," "adjacent to," or "directly adjacent to," should be construed in the same way.

Throughout the specification, the same reference numerals will refer to the same or like parts.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The example term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The example terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Example embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described with reference to the attached drawings.

FIG. 1 is a plan view of a display device according to one embodiment.

Referring to FIG. 1, the display device may include a display area AA where an image is displayed and a non-display area adjacent to the display area AA. The display area AA may include a plurality of pixels. The non-display area may not include a pixel. The non-display area may include a first peripheral area PAa surrounding the display area AA, a bending area BA protruding from the lower side of the first peripheral area PAa, and a second peripheral area PAb protruding from the lower side of the bending area BA. The first peripheral area PAa and the second peripheral area PAb may form a peripheral area PA.

The display area AA may have a quadrilateral shape on a plane defined by a first direction DR1 and a second direction DR2 perpendicular to the first direction DR1, and the corners of the display area AA may be angled.

The first peripheral area PAa may include a left first peripheral area adjacent to the left side of the display area AA, a right first peripheral area adjacent to the right side of the display area AA, an upper first peripheral area adjacent to the upper side of the display area AA, and a lower first peripheral area adjacent to the lower side of the display area AA.

Since a data pad unit PD for connecting a driving unit and an external signal transmission pad FOP are disposed in the second peripheral area PAb, the second peripheral area PAb may have a width greater than the width of the first peripheral area PAa.

The bending area BA may be a portion where the display device is folded.

At this time, the length of the bending area BA in the first direction DR1 may be smaller than the length of the display area AA in the first direction DR1. Accordingly, data lines DL located more outside in the first direction DR1 than a spider line DSPL disposed in the first lower peripheral area, the bending area BA, and the second peripheral area PAb may be connected to the spider line DSPL through a connection line CL. The data lines DL may be connected to a pixel PX and extend along the second direction DR2.

The spider line DSPL may be electrically connected to the data line DL and the data pad unit PD in the display area AA. The spider line DSPL may be connected to a plurality of pixels PX in the display area AA through the data line DL and may be connected to a multiplexer circuit unit MCP.

A chip including a data driver DD may be connected to the data pad unit PD or a chip-on plastic COP (not shown). A drive board FPC including a timing controller may be connected to the external signal application pad FOP. The data pad unit PD may include a plurality of pads arranged along the first direction DR1.

On the other hand, the display device according to one embodiment may further include the multiplexer circuit unit MCP. The multiplexer circuit unit MCP may be spaced apart from the display area AA with the bending area BA interposed therebetween. The multiplexer circuit unit MCP may be disposed in the second peripheral area PAb.

Figure 2:
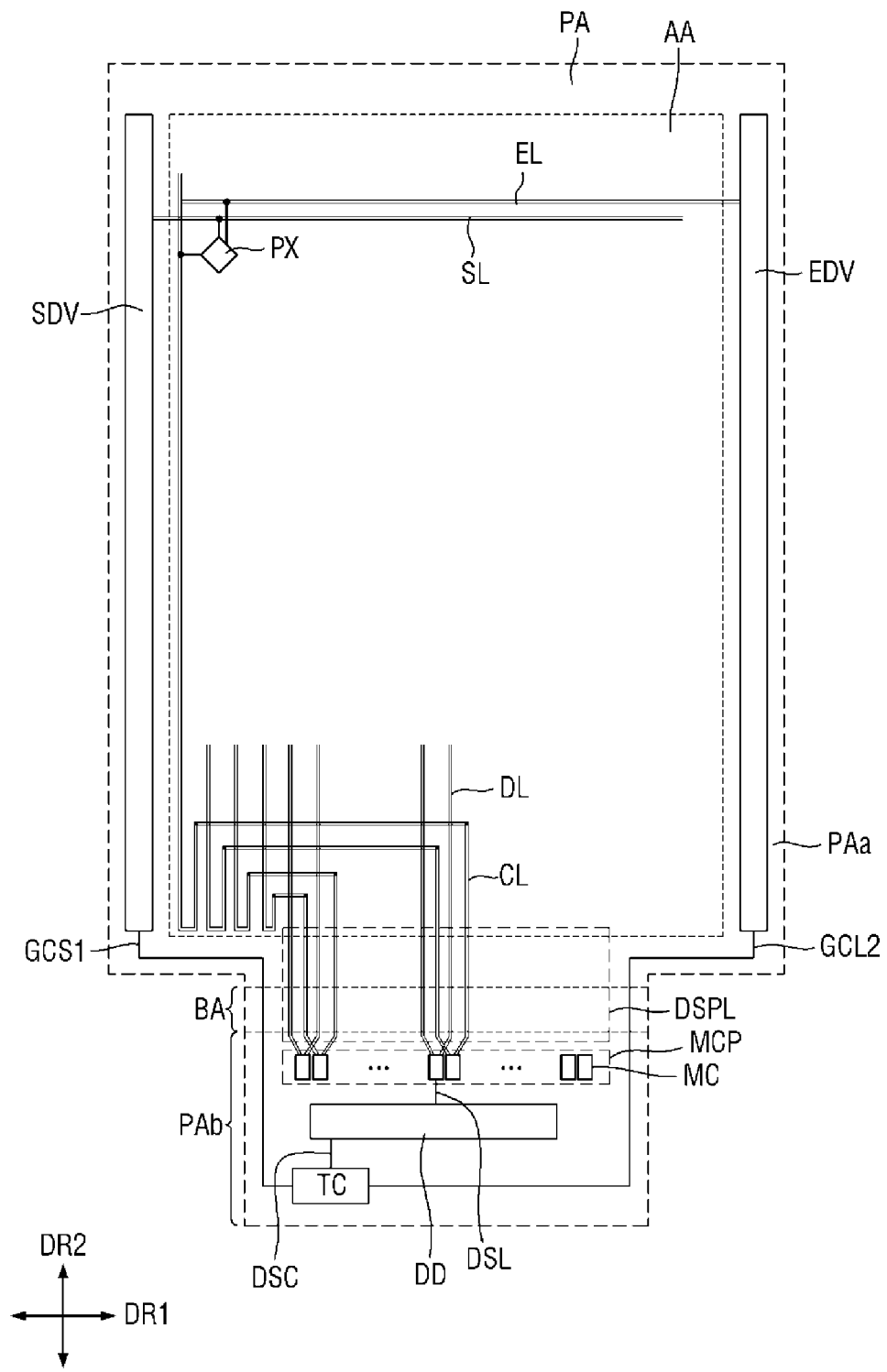
FIG. 2 is a block diagram showing an embodiment of pixels and a driving unit according to one embodiment.

FIG. 2 is a block diagram showing an embodiment of pixels and a driving unit according to one embodiment.

Referring to FIGS. 1 and 2, the display device includes the plurality of pixels PX, the driving unit, and a wiring unit.

The driving unit includes a scan driver SDV, an emission driver EDV, a data driver DD, and a timing controller TC. In FIG. 2, the positions of the scan driver SDV, the emission driver EDV, the data driver DD, and the timing controller TC are set for simplicity of description. Therefore, they may be disposed at other positions in the display device at the time of actually implementing the display device.

The wiring unit provides the signal of the driving unit to each pixel PX, and includes scan lines SL, the data lines DL, emission control lines EL, first and second power supply lines (not shown), and an initialization power line (not shown).

The scan line SL, the data line DL, and the emission control line EL may be electrically connected to each pixel PX.

When the scan signal is supplied from the scan lines SL, the pixels PX receive the data signal from the data lines DL. The pixels PX that have received the data signal may control the amount of current flowing from a first power supply ELVDD to a second power supply ELVSS through an organic light emitting element (not shown).

The scan driver SDV may supply the scan signal to the scan lines SL in response to a first gate control signal GCS1 from the timing controller TC. When the scan signal is sequentially supplied to the scan lines SL, the pixels PX may be sequentially selected on a horizontal line basis.

The emission driver EDV may supply an emission control signal to the emission control lines EL in response to a second gate control signal GCS2 from the timing controller TC. The emission driver EDV may sequentially supply the emission control signal to the emission control lines EL.

In addition, the emission control signal may be set to a gate-off voltage (e.g., high voltage) so that the transistors included in the pixels PX may be turned off, or may be set to a gate-on voltage (e.g., low voltage) so that the transistors included in the pixels PX may be turned on.

The data driver DD may supply the data signal to the data lines DL in response to a data control signal DCS. The data signal supplied to the data lines DL is supplied to the pixels PX selected by the scan signal.

The timing controller TC supplies the first and second gate control signals generated based on the timing signals supplied from the outside to the scan driver SDV and the emission driver EDV, and supplies the data control signals DCS to the data driver DD.

Each of the first and second gate control signals may include a start pulse and clock signals. The start pulse may control timing of a first scan signal or a first emission control signal. The clock signals may be used to shift the start pulse.

The data control signal DCS may include the source start pulse and the clock signals. The source start pulse controls a sampling start point of data. The clock signals may be used to control the sampling operation.

The data driver DD may be connected to the multiplexer circuit unit MCP through the data signal line DSL.

As shown in FIG. 2, the data line DL may be directly connected to the spider line DSPL, or may be connected to the spider line DSPL through the connection line CL. The spider line DSPL, the connection line CL, and the data line DL will be described in detail later.

The multiplexer circuit unit MCP may include a plurality of multiplexer circuits MC. The circuit diagram of each of the multiplexer circuits MC will be described in detail later in FIG. 5. The plurality of multiplexer circuits MC may be arranged along the first direction DR1.

Figure 3:
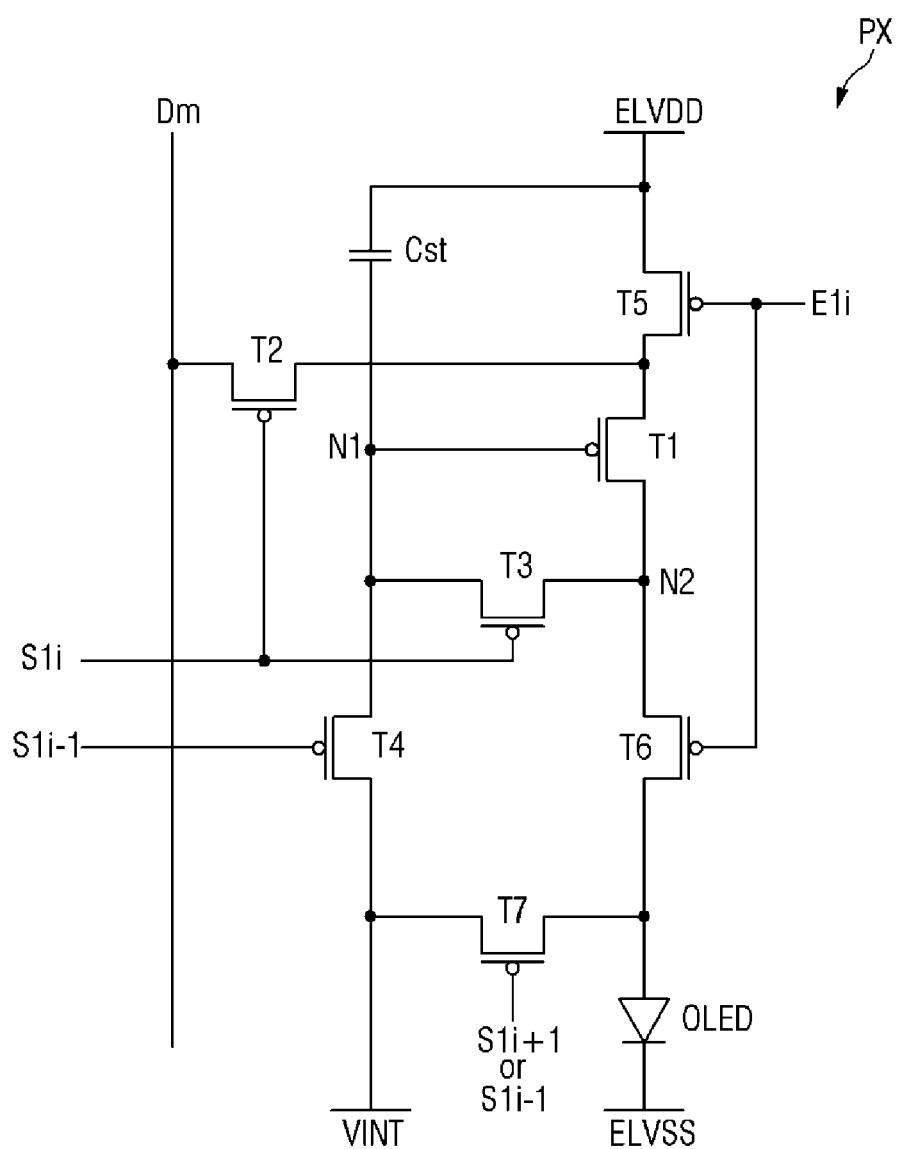
FIG. 3 is a diagram showing an embodiment of the pixel shown in FIG. 2.

FIG. 3 is a diagram showing an embodiment of the pixel shown in FIG. 2.

Referring to FIG. 3, the pixel connected to an $m^{th}$ data line Dm and an $i^{th}$ first scan line S1$i$ is illustrated for simplicity of description.

The pixel PX according to the embodiment of the present disclosure may include an organic light emitting diode OLED, first, second, third, fourth, fifth, sixth, and seventh transistors T1, T2, T3, T4, T5, T6, and T7, and a storage capacitor Cst.

The anode of the organic light emitting diode OLED may be connected to the first transistor T1 through the sixth transistor T6, and the cathode of the organic light emitting diode OLED may be connected to the second power source ELVSS. This organic light emitting diode OLED may generate light having a predetermined luminance corresponding to the amount of current supplied from the first transistor T1.

The first power source ELVDD may be set to a higher voltage than the second power source ELVSS so that a current may flow toward the organic light emitting diode OLED.

The seventh transistor T7 may be connected between an initialization power supply Vint and the anode of the organic light emitting diode OLED. Then, the gate electrode of the seventh transistor T7 may be connected to an $(i+1)^{th}$ first scan line S1i+1 or an (i−1)$^{th}$ first scan line S1. When the scan signal is supplied to the i$^{th}$ first scan line S1i, the seventh transistor T7 may be turned on to supply the voltage of the initialization power supply Vint to the anode of the organic light emitting diode OLED. Here, the initialization power supply Vint may be set to a lower voltage than the data signal.

The sixth transistor T6 is connected between the first transistor T1 and the organic light emitting diode OLED. Further, the gate electrode of the sixth transistor T6 may be connected to an i$^{th}$ first emission control line E1i. The sixth transistor T6 may be turned off when the emission control signal is supplied to the i$^{th}$ first emission control line E1i and turned on in other cases.

The fifth transistor T5 may be connected between the first power supply ELVDD and the first transistor T1. Then, the gate electrode of the fifth transistor T5 may be connected to the i$^{th}$ first emission control line E1i. The fifth transistor T5 may be turned off when the emission control signal is supplied to the i$^{th}$ first emission control line E1i and turned on in other cases.

The first electrode of the first transistor T1 (driving transistor) may be connected to the first power supply ELVDD through the fifth transistor T5, and the second electrode of the first transistor T1 may be connected to the anode of the organic light emitting diode OLED through the sixth transistor T6. Further, the gate electrode of the first transistor T1 may be connected to a first node N1. The first transistor T1 may control the amount of current flowing from the first power supply ELVDD to the second power supply ELVSS through the organic light emitting diode OLED in response to the voltage of the first node N1.

The third transistor T3 may be connected between the second electrode of the first transistor T1 and the first node N1. Then, the gate electrode of the third transistor T3 may be connected to the i$^{th}$ first scan line S1i. When the scan signal is supplied to the i$^{th}$ first scan line S1i, the third transistor T3 may be turned on to electrically connect the second electrode of the first transistor T1 to the first node N1. Therefore, when the third transistor T3 is turned on, the first transistor T1 may be connected in the form of a diode.

The fourth transistor T4 may be connected between the first node N1 and the initialization power supply Vint. Further, the gate electrode of the fourth transistor T4 may be connected to the (i−1)$^{th}$ first scan line S1i−1. When the scan signal is supplied to the (i−1)$^{th}$ first scan line S1i−1, the fourth transistor T4 may be turned on to supply the voltage of the initialization power supply Vint to the first node N1.

The second transistor T2 may be connected between the m$^{th}$ data line Dm and the first electrode of the first transistor T1. Further, the gate electrode of the second transistor T2 may be connected to the i$^{th}$ first scan line S1i. When the scan signal is supplied to the i$^{th}$ first scan line S1i, the second transistor T2 may be turned on to electrically connect the m$^{th}$ data line Dm to the first electrode of the first transistor T1.

The storage capacitor Cst may be connected between the first power supply ELVDD and the first node N1. The storage capacitor Cst may store the data signal and the voltage corresponding to the threshold voltage of the first transistor T1.

In some embodiments, the first transistor T1, the second transistor ST2, the fourth transistor T4, the fifth transistor T5, and the seventh transistor T7 may be formed as a P-type MOSFET, and the third transistor T3 and the fourth transistor T4 may be formed as an N-type MOSFET.

Further, each active layer formed as the P-type MOSFET may be made of polysilicon, and each active layer formed as the N-type MOSFET may be made of an oxide semiconductor.

Figure 4:
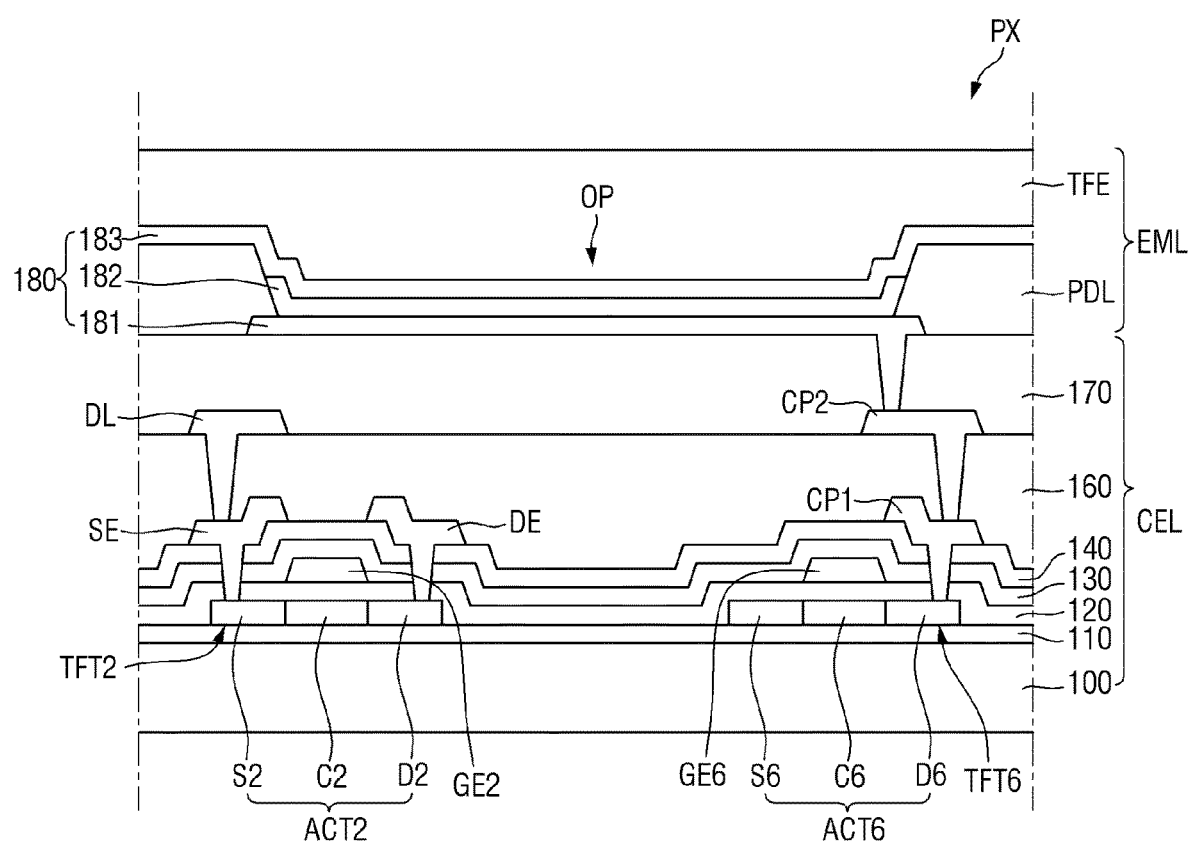
FIG. 4 is a cross-sectional view of the pixel of FIG. 3.

FIG. 4 is a cross-sectional view of the pixel of FIG. 3. FIG. 4 shows a cross-sectional view corresponding to the pixel PX in the cross-sectional view of the display device.

Referring to FIG. 4, the display device according to one embodiment may include a base substrate 100, a buffer layer 110, an active pattern ACT, a first gate insulating layer 120, a first gate conductive layer including a second gate electrode GE2 and a sixth gate electrode GE6, a second gate insulating layer 130, an interlayer insulating layer 140, a first data conductive layer including a source electrode SE, a drain electrode DE, and a first contact pad CP1, a first insulating layer 160, a second data conductive layer including the data line DL and a second contact pad CP2, a second insulating layer 170, a pixel defining layer PDL, a light emitting structure 180, and a thin film encapsulation layer TFE. The buffer layer 110, the active pattern ACT, the first gate insulating layer 120, the first gate conductive layer including the second gate electrode GE2 and the sixth gate electrode GE6, the second gate insulating layer 130, the interlayer insulating layer 140, the first data conductive layer including the source electrode SE, the drain electrode DE, and the first contact pad CP1, the first insulating layer 160, the second data conductive layer including the data line DL and the second contact pad CP2, the second insulating layer 170 may constitute a circuit element layer CEL. The pixel defining layer PDL and the light emitting structure 180 may constitute a light emitting element layer EML.

The base substrate 100 may include a transparent insulating substrate. For example, the base substrate 100 may be a flexible transparent resin substrate. The transparent resin substrate may include a polyimide-based resin, an acryl-based resin, a polyacrylate-based resin, a polycarbonate-based resin, a polyether-based resin, a sulfonic acid-based resin, a polyethyleneterephthalate-based resin, or the like. Preferably, the base substrate 100 may be a polyimide (PI) resin film.

The buffer layer 110 may prevent a phenomenon that metal atoms or impurities are diffused from the base substrate 100, and may control a heat transfer rate in a crystallization process for forming the active pattern ACT to be described later to obtain a substantially uniform active pattern ACT. Further, when the surface of the base substrate 100 is not uniform, the buffer layer 110 may serve to improve flatness of the surface of the base substrate 100. The buffer layer 110 may be formed using a silicon compound such as silicon oxide (SiOx), silicon nitride (SiNx), silicon oxynitride (SiOxNy), silicon oxycarbide (SiOxCy), and silicon carbonitride (SiCxNy).

The buffer layer 110 may not be formed in the bending area BA of the peripheral area PA. In other words, the buffer layer 110 may not be formed in the bending area FA or may be removed. This is because the bending area BA is a folded portion in a final product and, thus, damage such as cracks or the like may occur in the buffer layer 110 when the buffer layer 110 that is an inorganic layer is formed in the bending area BA. Similarly, the insulating layers 120, 130 and the like that are inorganic layers may not be formed in the bending area BA.

The active patterns ACT2 and ACT6 may be disposed on the buffer layer 110. The active patterns ACT2 and ACT6 may include thin film transistors TFT2 and TFT6 disposed in the display area DA and forming a pixel structure and active patterns (not shown) disposed in the peripheral area PA and forming a drive circuit. The driving circuit may be an amorphous silicon gate (ASG) circuit.

The active patterns ACT2 and ACT6 of the thin film transistors TFT2 and TFT6 may include drain regions D2 and D6 and source regions S2 and S6, which are doped with a large amount of impurities, and channel regions C2 and C6 disposed between the drain regions D2 and D6 and the source regions S2 and S6, respectively. The thin film transistors TFT2 and TFT6 may be the second transistor and the sixth transistor of FIG. 3, respectively.

The first gate insulating layer 120 may be disposed on the buffer layer 110 where the active patterns ACT2 and ACT6 are arranged. The first gate insulating layer 120 may include a silicon compound, a metal oxide, or the like.

The first gate conductive layer may be disposed on the gate insulating layer 120.

The first gate conductive layer may include gate electrodes GE2 and GE6 of the thin film transistor TFT2 and TFT6, a signal line such as a gate line for transmitting a signal for driving the pixel, and the like. The first gate conductive layer may be made of a metal, an alloy, metal nitride, conductive metal oxide, a transparent conductive material, or the like. For example, the first gate conductive layer may be made of a metal such as copper, aluminum, molybdenum, or the like. Further, the first gate conductive layer may have a layered structure of multiple layers. For example, the first gate conductive layer may include a copper layer and a molybdenum layer disposed on the copper layer.

The second gate insulating layer 130 may be disposed on the first gate conductive layer. The second gate insulating layer 130 may be formed using a silicon compound such as silicon oxide (SiOx), silicon nitride (SiNx), silicon oxynitride (SiOxNy), silicon oxycarbide (SiOxCy), and silicon carbonitride (SiCxNy).

Although not shown, a second gate conductive layer may be further disposed on the second gate insulating layer 130. The second gate conductive layer may be made of a metal, an alloy, metal nitride, conductive metal oxide, a transparent conductive material, or the like. For example, the second gate conductive layer may be made of a metal such as copper, aluminum, molybdenum, or the like. Further, the second gate conductive layer may have a layered structure of multiple layers. For example, the second gate conductive layer may include a copper layer and a molybdenum layer disposed on the copper layer.

The interlayer insulating layer 140 may be disposed on the second gate conductive layer. The first data conductive layer may be disposed on the interlayer insulating layer 140. The first data conductive layer may include the source electrode SE, the drain electrode DE, and the first contact pad CP1.

The source electrode SE may be connected to the source region S2 through the contact hole penetrating the interlayer insulating layer 140, the second gate insulating layer 130, and the first gate insulating layer 120. The drain electrode DE may be connected to the drain region D2 through the contact hole penetrating the interlayer insulating layer 140, the second gate insulating layer 130, and the first gate insulating layer 120. The first contact pad CP1 may be connected to the drain region D6 through the contact hole penetrating the interlayer insulating layer 140, the second gate insulating layer 130, and the first gate insulating layer 120.

The first data conductive layer may be made of a metal, an alloy, metal nitride, conductive metal oxide, a transparent conductive material, or the like. For example, the first data conductive layer may be made of a metal such as copper or aluminum having high conductivity. The first data conductive layer may have a layered structure of multiple layers. For example, the first data conductive layer may include a titanium layer, an aluminum layer on the titanium layer, and a titanium layer on the aluminum layer.

The first insulating layer 160 may be disposed on the interlayer insulating layer 140 where the first data conductive layer is disposed. The first insulating layer 160 may contain an organic insulating material, and may have a substantially flat top surface while sufficiently covering the first data conductive layer.

The second data conductive layer may be disposed on the first insulating layer 160. The second data conductive layer may include the data line DL and the second contact pad CP2. The second data conductive layer may be made of a metal, an alloy, metal nitride, conductive metal oxide, a transparent conductive material, or the like.

The second insulating layer 170 may be disposed on the first insulating layer 160 where the second data conductive layer is disposed. The second insulating layer 170 may contain an organic insulating material, and may have a substantially flat top surface while sufficiently covering the second data conductive layer.

The light emitting structure 180 may include a first electrode 181, a light emitting layer 182, and a second electrode 183.

The first electrode 181 may be disposed on the second insulating layer 170. The first electrode 181 may be electrically connected to the thin film transistor TFT 6 through contact holes formed through the second insulating layer 170. For example, the first electrode 181 may be connected to the thin film transistor TFT6 through the second contact pad CP2 and the first contact pad CP1.

Depending on the light emitting method of the display device, the first electrode 181 may be made of a reflective material or a light transmitting material. For example, the first electrode 181 may contain aluminum, aluminum-containing alloy, aluminum nitride, silver, silver-containing alloy, zinc oxide, indium tin oxide, tin oxide, indium oxide, gallium oxide, indium zinc oxide, or the like. These may be used alone or in combination with each other. In an example embodiment, the first electrode 181 may have a single layer structure or a multilayer structure including a metal layer, an alloy layer, a metal nitride layer, a conductive metal oxide layer and/or a transparent conductive material layer.

The pixel defining layer PDL may be disposed on the second insulating layer 170 where the first electrode 181 is disposed. The pixel defining layer PDL may be made of an organic material, an inorganic material, or the like. For example, the pixel defining layer PDL may be made of a photoresist, a polyacrylic resin, a polyimide-based resin, an acrylic resin, a silicon compound, or the like. In accordance with example embodiments, the pixel defining layer PDL may be etched to form an opening OP that partially exposes the first electrode 181. The display area and the non-display area of the display device may be defined by the opening OP of the pixel defining layer PDL. For example, the portion where the opening of the pixel defining layer PDL is disposed may correspond to the display area, and the non-display area may correspond to the portion adjacent to the opening of the pixel defining layer PDL.

The light emitting layer 182 may be disposed on the first electrode 181 exposed through the opening OP of the pixel defining layer PDL. Further, the light emitting layer 182 may extend on the sidewall of the opening of the pixel defining layer PDL. In example embodiments, the light emitting layer

182 may have a multilayer structure including an organic light emitting layer EL (not shown), a hole injecting layer HIL (not shown), a hole transporting layer HTL (not shown), an electron transporting layer ETL (not shown), an electron injecting layer EIL (not shown), or the like. In another embodiment, the hole injecting layer, the hole transporting layer, the electron transporting layer, and the electron injecting layer except the organic light emitting layer may be commonly formed to correspond to a plurality of pixels. The organic light emitting layer of the light emitting layer 182 may be made of light emitting materials capable of generating different color lights such as red light, green light, blue light, and the like depending on the pixels of the display device. In accordance with other example embodiments, the organic light emitting layer of the light emitting layer 182 may have a structure in which a plurality of light emitting materials capable of implementing different color lights such as red light, green light, blue light, and the like are stacked to emit white light. At this time, the light emitting structures may be commonly formed to correspond to a plurality of pixels, and the pixels may be distinguished by the color filter layer.

The second electrode 183 may be disposed on the pixel defining layer PDL and the light emitting layer 182. Depending on the light emitting method of the display device, the second electrode 183 may contain a light transmitting material or a reflective material. For example, the second electrode 183 may contain aluminum, aluminum-containing alloy, aluminum nitride, silver, silver-containing alloy, tungsten, tungsten nitride, copper, copper-containing alloy, nickel, chromium, chromium nitride, molybdenum, molybdenum-containing alloy, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, or the like. These may be used alone or in combination with each other. In example embodiments, the second electrode 183 may also have a single layer structure or a multilayer structure including a metal layer, an alloy layer, a metal nitride layer, a conductive metal oxide layer and/or a transparent conductive material layer.

The thin film encapsulation layer TFE may be disposed on the second electrode 183. The thin film encapsulation layer TFE may prevent the permeation of external moisture and oxygen. The thin film encapsulation layer TFE may include at least one organic layer and at least one inorganic layer. At least one organic layer and at least one inorganic layer may be stacked alternately. For example, the thin film encapsulation layer TFE may, but not necessarily, include two inorganic layers and one organic layer disposed therebetween. In another embodiment, an encapsulation substrate may be provided, instead of the thin film encapsulation layer, to prevent external air and moisture from permeating into the display device.

Figure 5:
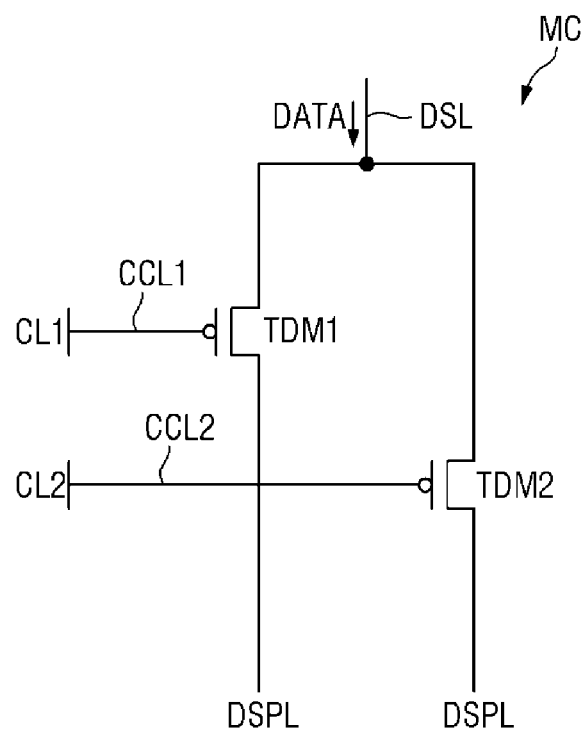
FIG. 5 is a circuit diagram of a multiplexer circuit of a display device according to one embodiment.

FIG. 5 is a circuit diagram of a multiplexer circuit of a display device according to one embodiment.

FIG. 5 illustrates the case where two spider lines DSPL are connected to the multiplexer circuit MC.

Referring to FIG. 5, the multiplexer circuit MC includes a first demultiplexer transistor TDM1 and a second demultiplexer transistor TDM2. Although the case where both the first demultiplexer transistor TDM1 and the second demultiplexer transistor TDM2 are PMOS transistors is illustrated in the drawing, the present disclosure is not limited thereto. Each of the first demultiplexer transistor TDM1 and the second demultiplexer transistor TDM2 includes a first electrode, a second electrode, and a gate electrode.

A data signal DATA outputted from the data driver DD is provided to the first electrode of the first demultiplexer transistor TDM1. The second electrode of the first demultiplexer transistor TDM1 may be electrically connected to one of the spider lines DSPL. A first demultiplexer select signal CL1 may be provided to the gate electrode of the first demultiplexer transistor TDM1 through a first demultiplexer select signal line CLL1. When the first demultiplexer select signal CL1 of a low level is applied to the gate electrode of the first demultiplexer transistor TDM1, the first demultiplexer transistor TDM1 may be turned on to output the data signal DATA to one of the spider lines DSPL.

The data signal DATA outputted from the data driver DD is provided to the first electrode of the second demultiplexer transistor TDM2. The second electrode of the second demultiplexer transistor TDM2 may be electrically connected to another spider line DSPL that is not connected to the first demultiplexer transistor TDM2. A second demultiplexer select signal CL2 may be provided to the gate electrode of the second demultiplexer transistor TDM2 through a second demultiplexer select signal line CLL2. When the second demultiplexer select signal CL2 of a low level is applied to the gate electrode of the second demultiplexer transistor TDM2, the second demultiplexer transistor TDM2 may be turned on to output the data signal DATA to another spider line DSPL connected to the second demultiplexer transistor TDM2.

When the first demultiplexer transistor TDM1 and the second demultiplexer transistor TDM2 are selectively turned on by the first demultiplexer select signal CL1 and the second demultiplexer select signal CL2, the data signal DATA may be selectively provided to the two spider lines DSPL. In some embodiments, data time division driving may be performed when the first demultiplexer select signal CL1 and the second demultiplexer select signal CL2 have different timings.

On the other hand, although the case where the data signal DATA provided from the data driver DD to the multiplexer circuit MC is provided to the two spider lines DSPL is illustrated in the embodiment, it is obvious to those skilled in the art that the data signal DATA may be provided to three or four or more spider lines DSPL. When one multiplexer circuit MC provides the data signal DATA to three or more spider lines DSPL, three or more demultiplexer transistors may be included in the multiplexer circuit MC.

Figure 6:
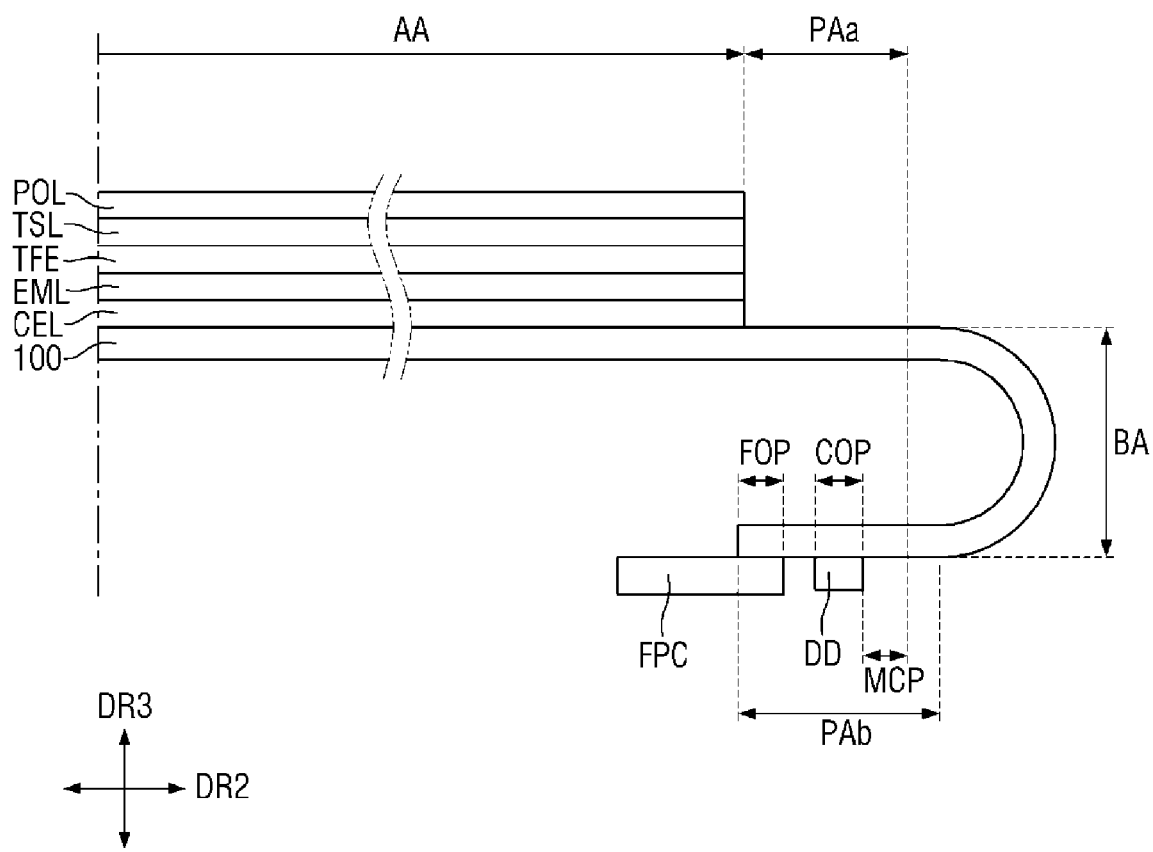
FIG. 6 is a schematic cross-sectional view showing a state in which a display device according to one embodiment is bent.

FIG. 6 is a schematic cross-sectional view showing a state in which a display device according to one embodiment is bent.

Referring to FIGS. 1 and 6, the base substrate 100 of the display device according to one embodiment is bent in the bending area BA, so that the first peripheral area PAa and the second peripheral area PAb may overlap in a thickness direction. The display area AA and the first peripheral area PAa of the display device may form an upper flat portion, and the second peripheral area PAb may form a lower flat portion. Since the multiplexer circuit unit MCP is disposed in the second peripheral area PAb, the multiplexer circuit unit MCP may be disposed to overlap the first peripheral area PAa. Accordingly, it is possible to reduce the area occupied by the first peripheral area PAa in the upper flat portion, compared to the case where the multiplexer circuit unit MCP is disposed in the first peripheral area PAa, which is advantageous in that the bezel of the device may be reduced.

On the other hand, in the display area AA, a touch device layer TSL and a polarizing member POL on the touch device layer TSL may be further disposed on the thin film encapsulation layer TFE. Since the touch device layer TSL and the polarizing member POL are well known in this technical field, the detailed description thereof will be omitted.

Figure 7:
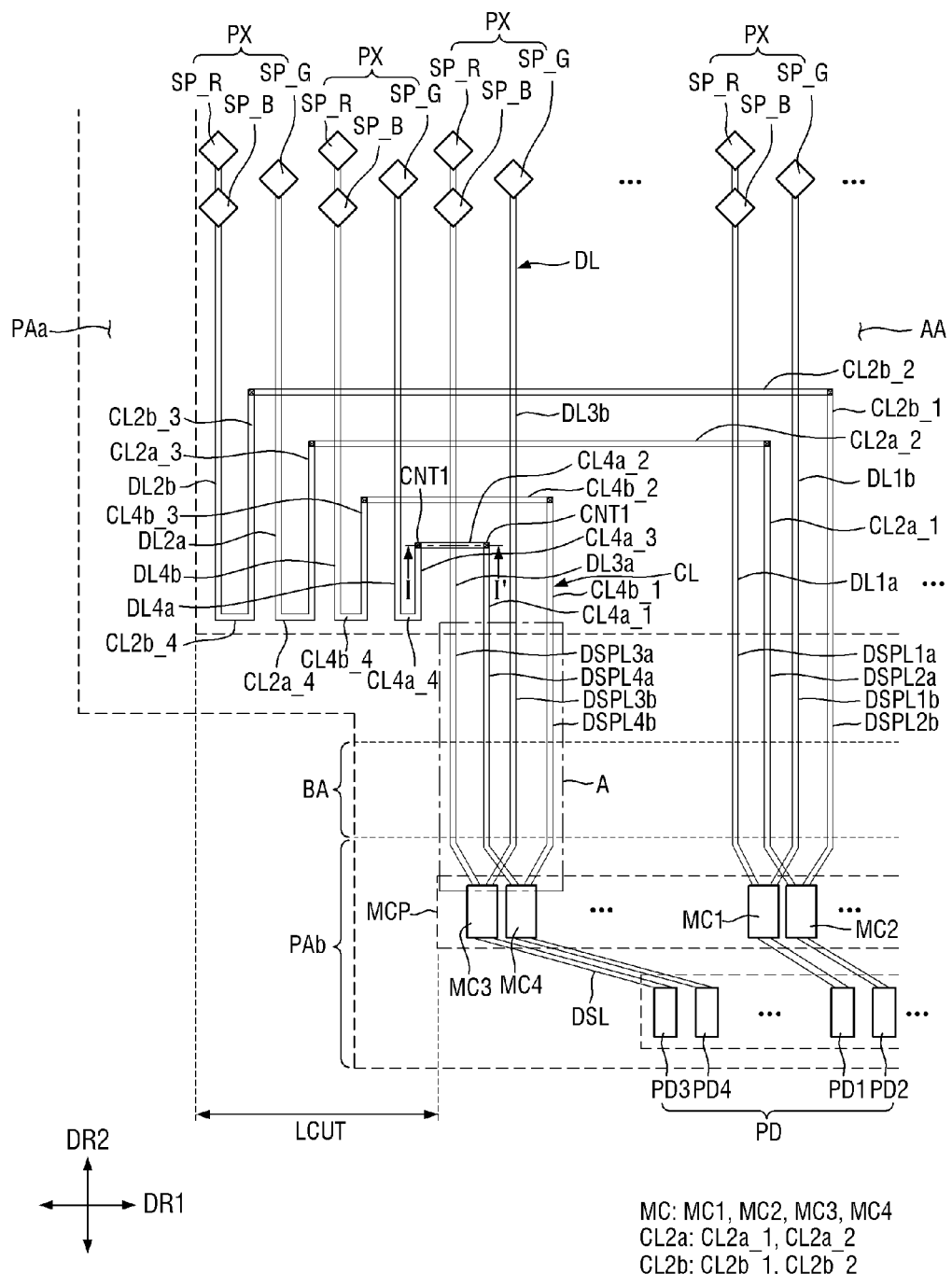
FIG. 7 is a plan view showing a part of a display area, a peripheral area, and a bending area of a display device according to one embodiment.

FIG. 7 is a plan view showing a part of a display area, a peripheral area, and a bending area of a display device according to one embodiment.

Referring to FIG. 7, the area from the left side of the display area AA to the left side of the multiplexer circuit unit MCP, i.e., the portion of the display area AA protruding leftward from the left side of the multiplexer circuit unit MCP may be defined as an LCUT portion. As described in FIG. 1, the data lines DL disposed more outside in the first direction DR1 than the spider line DSPL disposed in the first lower peripheral area, the bending area BA, and the second peripheral area PAb may be connected to the spider line DSPL through the connection line CL due to the formation of the LCUT portion.

The number of the data lines DL connected to the spider line DSPL through the connection line CL may vary depending on the length of the LCUT portion. For example, the number of the data lines DL connected to the spider line DSPL through the connection line CL may increase as the length of the LCUT portion increases, and the number of the data lines DL connected to the spider line DSPL through the connection line CL may decrease as the length of the LCUT portion decreases.

The data pad unit PD may include a plurality of pads PD1, PD2, PD3, and PD4, and the multiplexer circuit MC may include a plurality of multiplexer circuits MC1, MC2, MC3, and MC4. The plurality of pads PD1, PD2, PD3, and PD4 may be connected to the plurality of multiplexer circuits MC1, MC2, MC3, and MC4 through the data signal lines DSL, respectively.

As described in FIG. 5, each of the multiplexer circuits MC1, MC2, MC3, and MC4 may be branched into two spider lines DSPL. The spider line DSPL may be disposed in the second peripheral area PAb between the multiplexer circuit unit MCP and the bending area BA, the bending area BA, and the first peripheral area PAa.

The plurality of multiplexer circuits MC1, MC2, MC3, and MC4 may include the first multiplexer circuit MC1, the second multiplexer circuit MC2, the third multiplexer circuit MC3, and the fourth multiplexer circuit MC4. The plurality of spider lines DSPL may include a 1a spider line DSPL1a and a 1b spider line DSPL1b connected to the first multiplexer circuit MC1, a 2a spider line DSPL2a and a 2b spider line DSPL2b connected to the second multiplexer circuit MC2, a 3a spider line DSPL3a and a 3b spider line DSPL3b connected to the third multiplexer circuit MC3, and a 4a spider line DSPL4a and a 4b spider line DSPL4b connected to the fourth multiplexer circuit MC4.

The plurality of connection lines CL may include a 2a connection line CL2a connected to the 2a spider line DSPL2a, a 2b connection line CL2b connected to the 2b spider line DSPL2b, a 4a connection line connected to the 4a spider line DSPL4a, and a 4b connection line connected to the 4b spider line DSPL4b.

The plurality of data lines DL may include a 1a data line DL1a directly connected to the 1a spider line DSPL1a, a 1b data line DL1b directly connected to the 1b spider line DSPL1b, a 2a data line DL2a connected to the second spider line DSPL2a through the 2a connection line CL2a_3 and CL2a_4, a 2b data line DL2b connected to the 2b spider line DSPL2b through the 2b connection line CL2b_4, a 3a data line DL3a directly connected to the 3a spider line DSPL3a, a 3b data line DL3b directly connected to the 3b spider line DSPL3b, a 4a data line DL4a connected to the 4a spider line DSPL4a through the 4a connection line CL4a_4, and a 4b data line DL4b connected to the 4b spider line DSPL4b through the 4b connection line CL4b_4, CL4b_2, and CL4b_1.

On the other hand, the pixels PX may include a plurality of sub-pixels SP_R, SP_B, and SP_G. For example, the pixels PX may include a first sub-pixel SP_R, a second sub-pixel SP_B, and a third sub-pixel SP_G. The first sub-pixel SP_R may be a red pixel, the second sub-pixel SP_B may be a blue pixel, and the third sub-pixel SP_G may be a green pixel. However, the present disclosure is not limited thereto, and the first sub-pixel SP_R may be any of the red pixel, the green pixel, and the blue pixel, the second sub-pixel SP_B may be another one of the red pixel, the green pixel, and the blue pixel, and the third sub-pixel SP_G may be the other one of the red pixel, the green pixel, and the blue pixel.

The 1a data line DL1a, the 3a data line DL3a, the 2b data line DL2b, and the 4b data line DL4b may be connected to the first sub-pixel SP_R and the second sub-pixel SP_B, and the 1b data line DL1b, the 3b data line DL3b, the 2a data line DL2a, and the 4a data line DL4a may be connected to the third sub-pixel SP_G.

The 2a connection line CL2a may include a 2a_1 connection line CL2a_1 directly connected to the 2a spider line DSPL2a and extending along the second direction DR2, a 2a_2 connection line CL2a_2 connected to the 2a_1 connection line CL2a_1 and extending along the first direction DR1 while being bent from the 2a_1 connection line CL2a_1 in the first direction DR1 (or leftward), a 2a_3 connection line CL2a_3 connected to the 2a_2 connection line CL2a_2 and extending along the second direction DR2 while being bent in the second direction DR2 (or downward), and a 2a_4 connection line CL2a_4 connected to the 2a_3 connection line CL2a_3 and extending along the first direction DR1 while being bent from the 2a_3 connection line CL2a_3 in the first direction DR1 (or leftward) and directly connected to the 2a data line DL2a.

The 2b connection line CL2b may include a 2b_1 connection line CL2b_1 directly connected to the 2b spider line DSPL2b and extending along the second direction DR2, a 2b_2 connection line CL2b_2 connected to the 2b_1 connection line CL2b_1 and extending along the first direction DR1 while being bent from the 2b_1 connection line CL2b_1 in the first direction DR1 (or leftward), a 2b_3 connection line CL2b_3 connected to the 2b_2 connection line CL2b_2 and extending along the second direction DR2 while being bent in the second direction DR2 (or downward), and a 2b_4 connection line CL2b_4 connected to the 2b_3 connection line CL2b_3 and extending along the first direction DR1 while being bent from the 2b_3 connection line CL2b_3 in the first direction DR1 (or leftward) and directly connected to the 2b data line DL2b.

The 4a connection line CL4a may include a 4a_1 connection line CL4a_1 directly connected to the 4a spider line DSPL4a and extending along the second direction DR2, a 4a_2 connection line CL4a_2 connected to the 4a_1 connection line CL4a_1 and extending along the first direction DR1 while being bent from the 4a_1 connection line CL4a_1 in the first direction DR1 (or leftward), a 4a_3 connection line CL4a_3 connected to the 4a_2 connection line CL4a_2 and extending along the second direction DR2 while being bent in the second direction DR2 (or downward), and a 4a_4 connection line CL4a_4 connected to the 4a_3 connection line CL4a_3 and extending along the first direction DR1 while being bent from the 4a_3 connection line CL4*a*_3 along the first direction DR1 (or leftward) and directly connected to the 4a data line DL4*a*.

The 4b connection line CL4*b* may include a 4b_1 connection line CL4*b*_1 directly connected to the 4b spider line DSPL4*b* and extending along the second direction DR2, a 4b_2 connection line CL4*b*_2 connected to the 4b_1 connection line CL4*b*_1 and extending along the first direction DR1 while being bent from the 4b_1 connection line CL4*b*_1 in the first direction DR1 (or leftward), a 4b_3 connection line CL4*b*_3 connected to the 4b_2 connection line CL4*b*_2 and extending along the second direction DR2 while being bent in the second direction DR2 (or downward), and a 4b_4 connection line CL4*b*_4 connected to the 4b_3 connection line CL4*b*_3 and extending along the first direction DR1 while being bent from the 4b_3 connection line CL4*b*_3 along the first direction DR1 (or leftward) and directly connected to the 4b data line DL4*b*.

In the following, the cross-sectional structures of the 2a connection line, the 2b connection line, the 4a connection line, and the 4b connection line may be the same. In other word, the conductive layer to which the connection lines CL2*a*_2, CL2*b*_2, CL4*a*_2, and CL4*b*_2 of the 2a connection line, the 2b connection line, the 4a connection line, and the 4b connection line belong may be different from the conductive layer of the other connection lines except the connection lines CL2*a*_2, CL2*b*_2, CL4*a*_2, and CL4*b*_2 of the 2a connection line, the 2b connection line, the 4a connection line, and the 4b connection line. The other connection lines except the connection lines CL2*a*_2, CL2*b*_2, CL4*a*_2, and CL4*b*_2 of the 2a connection line, the 2b connection line, the 4a connection line, and 4b connection line may be located in the same layer. Therefore, referring to FIG. 8, the cross-sectional structure of the 4a_1 connection line, the 4a_2 connection line, and the 4a_3 connection line of the 4a connection line will be described, and the redundant description of the cross-sectional structure of the 2a connection line, the 2b connection line, and the 4b connection line or the cross-sectional structure of the 4a_4 connection line that has not been mentioned will be omitted.

Figure 8:
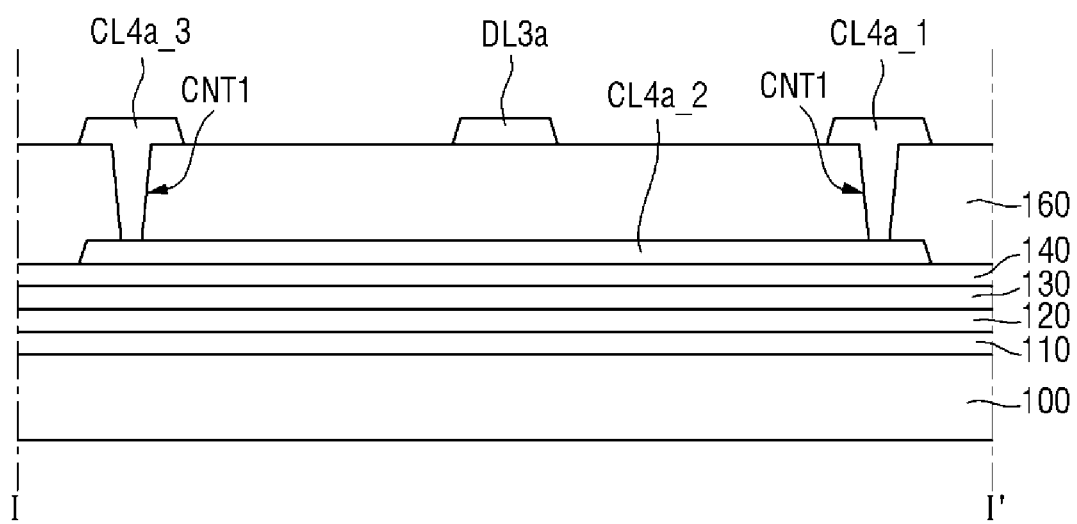
FIG. 8 is a cross-sectional view taken along line I-I' of FIG. 7.

FIG. 8 is a cross-sectional view taken along line I-I' of FIG. 7.

Referring to FIGS. 4, 7, and 8, the 4a_1 connection line CL4*a*_1 and the 4a_3 connection line CL4*a*_3 may be located in a second source-drain conductive layer, and the 4a_2 connection line CL4*a*_2 may be located in a first source-drain conductive layer. As shown in FIG. 8, the 4a_2 connection line CL4*a*_2 intersects (overlaps) the 3a data line DL3*a* located in the second source-drain conductive layer. However, the 4a_2 connection line CL4*a*_2 and the 3a data line DL3*a* are located in the different conductive layers, and thus may be insulated from each other.

The 4a_1 connection line CL4*a*_1 and the 4a_3 connection line CL4*a*_3 may be connected to the 4a_2 connection line CL4*a*_2 through a first contact hole CNT1. The first contact hole CNT1 may completely penetrate the first insulating layer 160 in the thickness direction.

On the other hand, the 1a spider line DSPL1*a* may include a 1a_1 spider line disposed in the second peripheral area PAb and connected to the first multiplexer circuit MC1, a 1a_2 spider line disposed in the bending area BA and connected to the 1a_1 spider line, and a 1a_3 spider line connected to the 1a_2 spider line and the 1a data line DL1*a* and disposed in the first peripheral area PAa.

The 1b spider line DSPL1*b* may include a 1b_1 spider line disposed in the second peripheral area PAb and connected to the third multiplexer circuit MC3, a 1b_2 spider line disposed in the bending area BA and connected to the 1b_1 spider line, and a 1b_3 spider line connected to the 1b_2 spider line and the 1b data line DL1*b* and disposed in the first peripheral area PAa.

The 2a spider line DSPL2*a* may include a 2a_1 spider line disposed in the second peripheral area PAb and connected to the second multiplexer circuit MC2, a 2a_2 spider line disposed in the bending area BA and connected to the 2a_1 spider line, and a 2a_3 spider line connected to the 2a_2 spider line and the 2a connection line and disposed in the first peripheral area PAa.

The 2b spider line DSPL2*b* may include a 2b_1 spider line disposed in the second peripheral area PAb and connected to the second multiplexer circuit MC2, a 2b_2 spider line disposed in the bending area BA and connected to the 2b_1 spider line, and a 2b_3 spider line connected to the 2b_2 spider line and the 2b connection line and disposed in the first peripheral area PAa.

The 3a spider line DSPL3*a* may include a 3a_1 spider line disposed in the second peripheral area PAb and connected to the third multiplexer circuit MC3, a 3a_2 spider line disposed in the bending area BA and connected to the 3a_1 spider line, and a 3a_3 spider line connected to the 3a_2 spider line and the 3a data line DL3*a* and disposed in the first peripheral area PAa.

The 3b spider line DSPL3*b* may include a 3b_1 spider line disposed in the second peripheral area PAb and connected to the third multiplexer circuit MC3, a 3b_2 spider line disposed in the bending area BA and connected to the 3b_1 spider line, and a 3b_3 spider line connected to the 3b_2 spider line and the 3b data line DL3*b* and disposed in the first peripheral area PAa.

The 4a spider line DSPL4*a* may include a 4a_1 spider line disposed in the second peripheral area PAb and connected to the fourth multiplexer circuit MC4, a 4a_2 spider line disposed in the bending area BA and connected to the 4a_1 spider line, and a 4a_3 spider line connected to the 4a_2 spider line and the 4a connection line and disposed in the first peripheral area PAa.

The 4b spider line DSPL4*b* may include a 4b_1 spider line disposed in the second peripheral area PAb and connected to the fourth multiplexer circuit MC4, a 4b_2 spider line disposed in the bending area BA and connected to the 4b_1 spider line, and a 4b_3 spider line connected to the 4b_2 spider line and the 4b connection line and disposed in the first peripheral area PAa.

The cross-sectional structures of the 1a spider line DSPL1*a*, the 1b spider line DSPL1*b*, the 3a spider line DSPL3*a*, and the 3b spider line DSPL3*b* may be substantially the same, and the cross-sectional structures of the 2a spider line DSPL2*a*, the 2b spider line DSPL2*b*, the 4a spider line DSPL4*a*, and the 4b spider line DSPL4*b* may be substantially the same. Therefore, in the following, the description of the cross-sectional structures of the 1a spider line DSPL1*a*, the 1b spider line DSPL1*b*, and the 3a spider line DSPL3*a* will be omitted in describing the cross-sectional structure of the 3b spider line DSPL3*b*, and the description of the cross-sectional structures of the 2a spider line DSPL2*a*, the 2b spider line DSPL2*b*, and the 4b spider line DSPL4*b* will be omitted in describing the cross-sectional structure of the 4a spider line DSPL4*a*.

Figure 9:
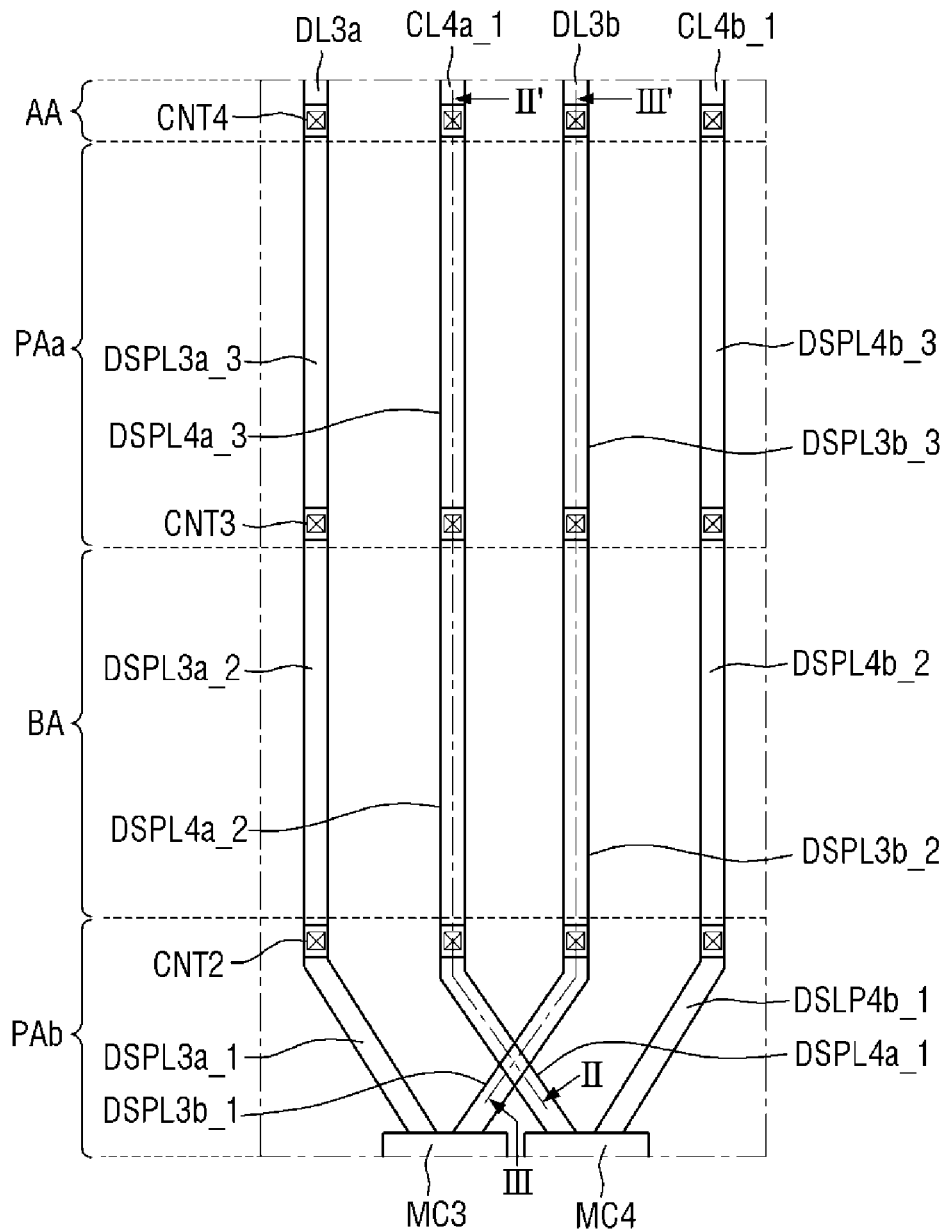
FIG. 9 is an enlarged plan view of area A of FIG. 7.
Figure 10:
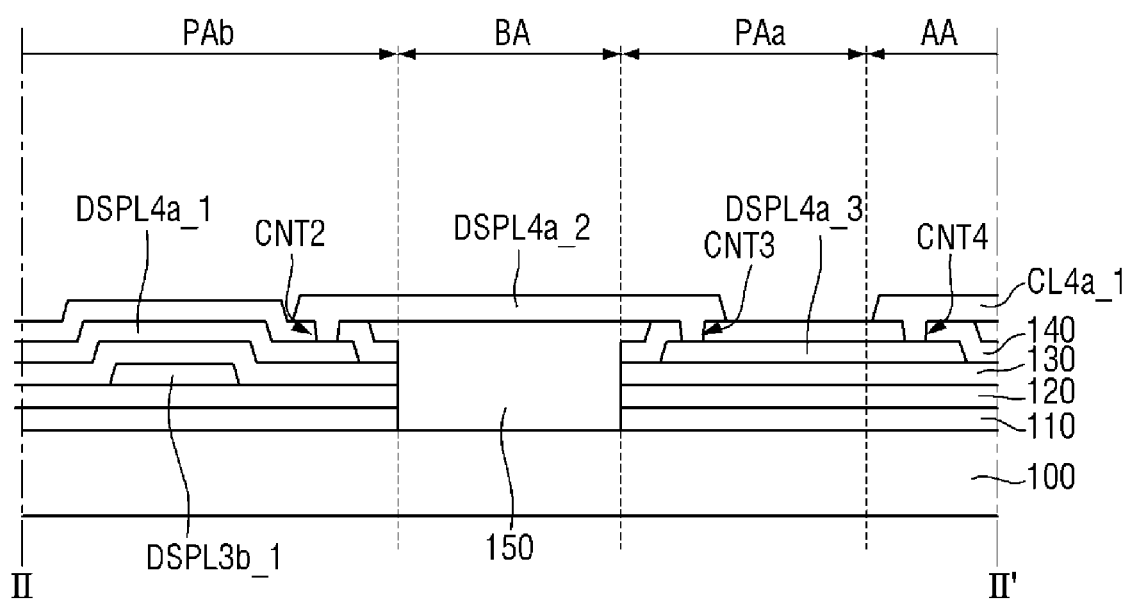
FIG. 10 is a cross-sectional view taken along line II-II' of FIG. 9.
Figure 11:
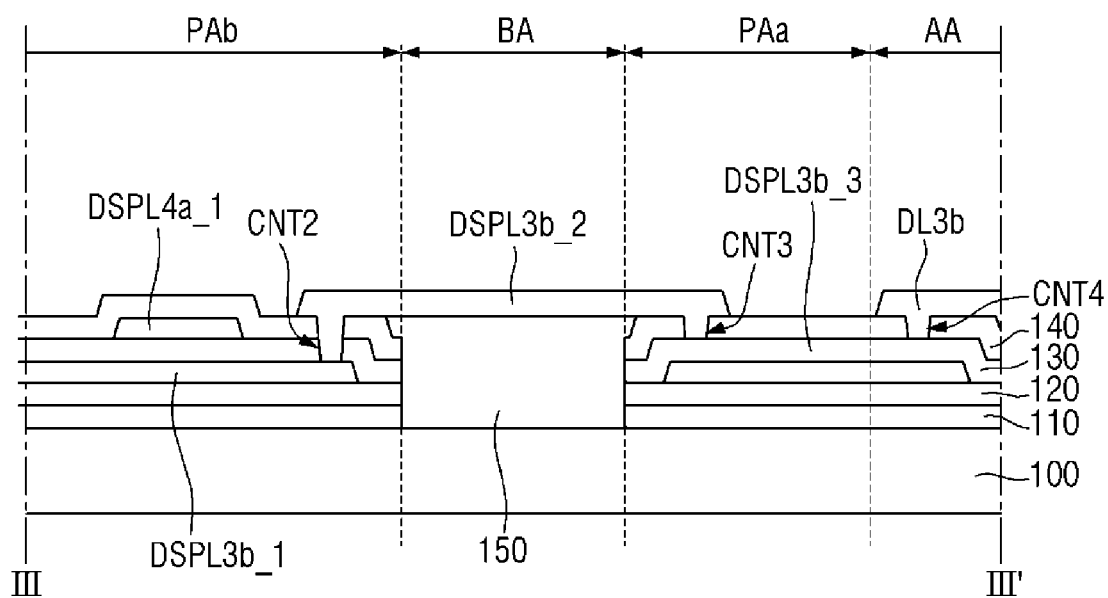
FIG. 11 is a cross-sectional view taken along line III-III' of FIG. 9.

FIG. 9 is an enlarged plan view of area A of FIG. 7. FIG. 10 is a cross-sectional view taken along line II-II' of FIG. 9. FIG. 11 is a cross-sectional view taken along line of FIG. 9.

Referring to FIGS. 9, 10, and 11, the 3a spider line DSPL3*a* may include the 3a_1 spider line DSPL3*a*_1 disposed in the second peripheral area PAb and connected to the third multiplexer circuit MC3, the 3a_2 spider line DSPL3a_2 disposed in the bending area BA and connected to the 3a_1 spider line DSPL3a_1, and the 3a_3 spider line DSPL3a_3 connected to the 3a_2 spider line DSPL3a_2 and the 3a data line DL3a and disposed in the first peripheral area PAa.

The 3b spider line DSPL3b may include the 3b_1 spider line DSPL3b_1 disposed in the second peripheral area PAb and connected to the third multiplexer circuit MC3, the 3b_2 spider line DSPL3b_2 disposed in the bending area BA and connected to the 3b_1 spider line DSPL3b_1, and the 3b_3 spider line DSPL3b_3 connected to the 3b_2 spider line DSPL3b_2 and the 3b data line DL3b and disposed in the first peripheral area PAa.

The 4a spider line DSPL4a may include the 4a_1 spider line DSPL4a_1 disposed in the second peripheral area PAb and connected to the fourth multiplexer circuit MC4, the 4a_2 spider line DSPL4a_2 disposed in the bending area BA and connected to the 4a_1 spider line DSPL4a_1, and the 4a_3 spider line DSPL4a_3 connected to the 4a_2 spider line DSPL4a_2 and the 4a connection line and disposed in the first peripheral area PAa.

The 4b spider line DSPL4b may include the 4b_1 spider line DSPL4b_1 disposed in the second peripheral area PAb and connected to the fourth multiplexer circuit MC4, the 4b_2 spider line DSPL4b_2 disposed in the bending area BA and connected to the 4b_1 spider line DSPL4b_1, and the 4b_3 spider line DSPL4b_3 connected to the 4b_2 spider line DSPL4a_2 and the 4b connection line and disposed in the first peripheral area PAa.

Figure 12:
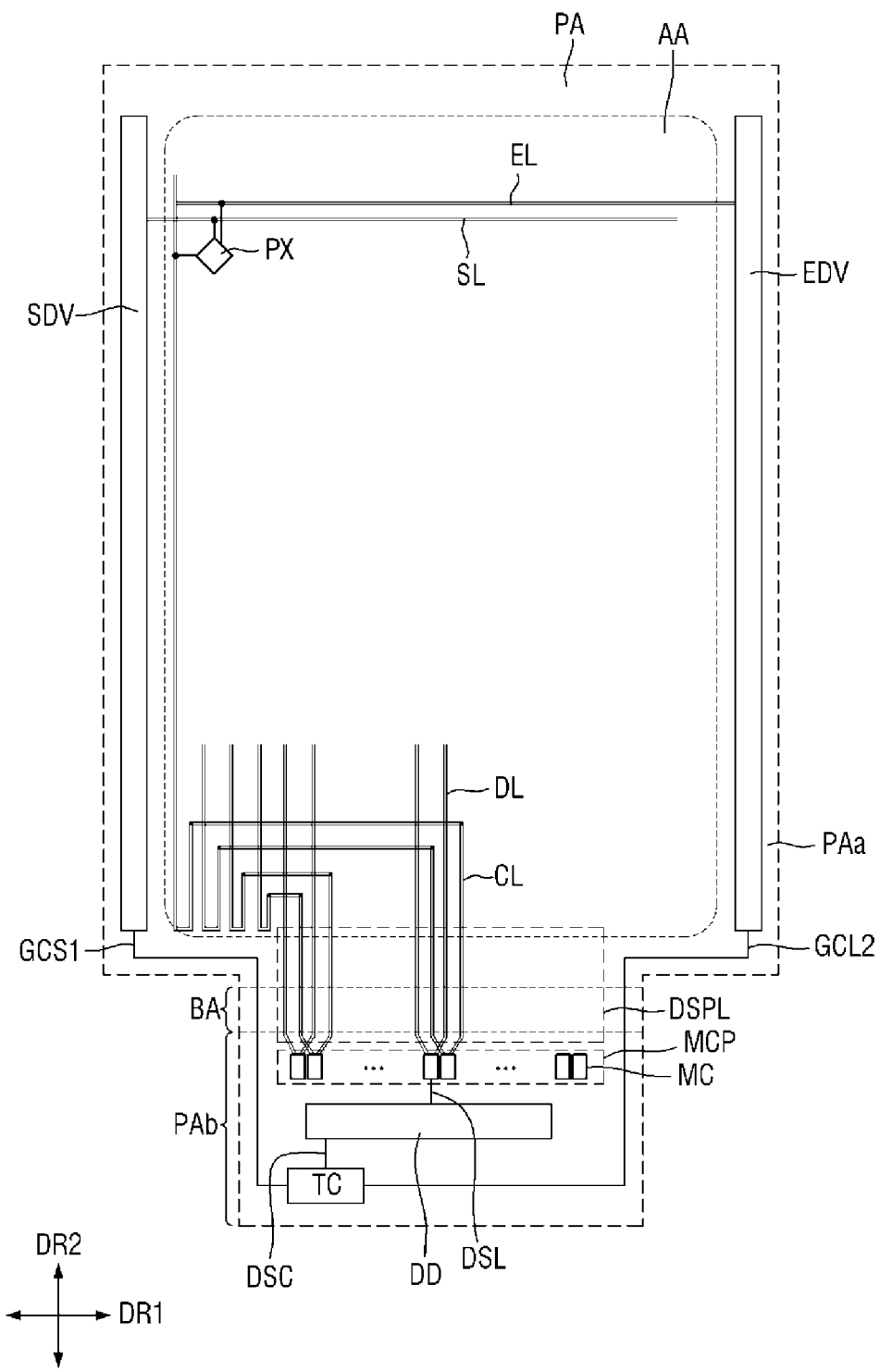
FIG. 12 is a block diagram showing an embodiment of pixels and a driving unit according to another embodiment.

As shown in FIGS. 11 and 12, in the bending area BA, the buffer layer 110, the first gate insulating layer 120, the second gate insulating layer 130, and the interlayer insulating layer 140 may be removed to expose the top surface of the base substrate 100.

A bending protection layer 150 may be further disposed on the top surface of the base substrate 100 exposed by removing the buffer layer 110, the first gate insulating layer 120, the second gate insulating layer 130, and the interlayer insulating layer 140. The bending protection layer 150 may contain the same material as the first insulating layer 160 (as shown in FIG. 8).

The bend protection layer 150 may be in direct contact with the exposed top surface of the base substrate 100.

On the other hand, depending on a stacking process, another organic layer as well as the bending protection layer 150 may be further disposed on the top surface of the base substrate 100 exposed by removing the buffer layer 110, the first gate insulating layer 120, the second gate insulating layer 130, and the interlayer insulating layer 140.

The 4a_1 spider line DSPL4a_1 and the 4a_3 spider line DSPL4a_3 may be located in the second gate conductive layer, and the 4a_2 spider line DSPL4a_2 may be located in the first source-drain conductive layer. The 4a_1 spider line DSPL4a_1 and the 4a_3 spider line DSPL4a_3 may be connected to the 4a_2 spider line DSPL4a_2 through contact holes CNT2 and CNT3, respectively. The contact holes CNT2 and CNT3 may penetrate the interlayer insulating layer 140 in the thickness direction.

The 3b_1 spider line DSPL3b_1 and the 3b_3 spider line DSPL3b_3 may be located in the first gate conductive layer, and the 3b_2 spider line DSPL3b_2 may be located in the first source-drain conductive layer. The 3b_1 spider line DSPL3b_1 and the 3b_3 spider line DSPL3b_3 may be connected to the 3b_2 spider line DSPL3b_2 through the contact holes CNT2 and CNT3, respectively.

On the other hand, as shown in FIGS. 9, 10, and 11, the spider lines DSPL4a_1 and DSPL3b_1 may intersect (or overlap). However, as in one embodiment, the spider lines DSPL4a_1 and DSPL3b_1 are located in different conductive layers and thus may be electrically insulated. However, the spider lines DSPL4a_1 and DSPL3b_1 may cross each other in the second peripheral area PAb.

In one embodiment, the case where the spider lines DSPL4a_1 and DSPL3b_1 intersect (or overlap) in a plan view in the second peripheral area PAb is illustrated.

Hereinafter, a display device according to another embodiment will be described. In the following embodiments, the same components as those of the above-described embodiment are denoted by the same reference numerals, and a description thereof will be omitted or simplified.

Figure 13:
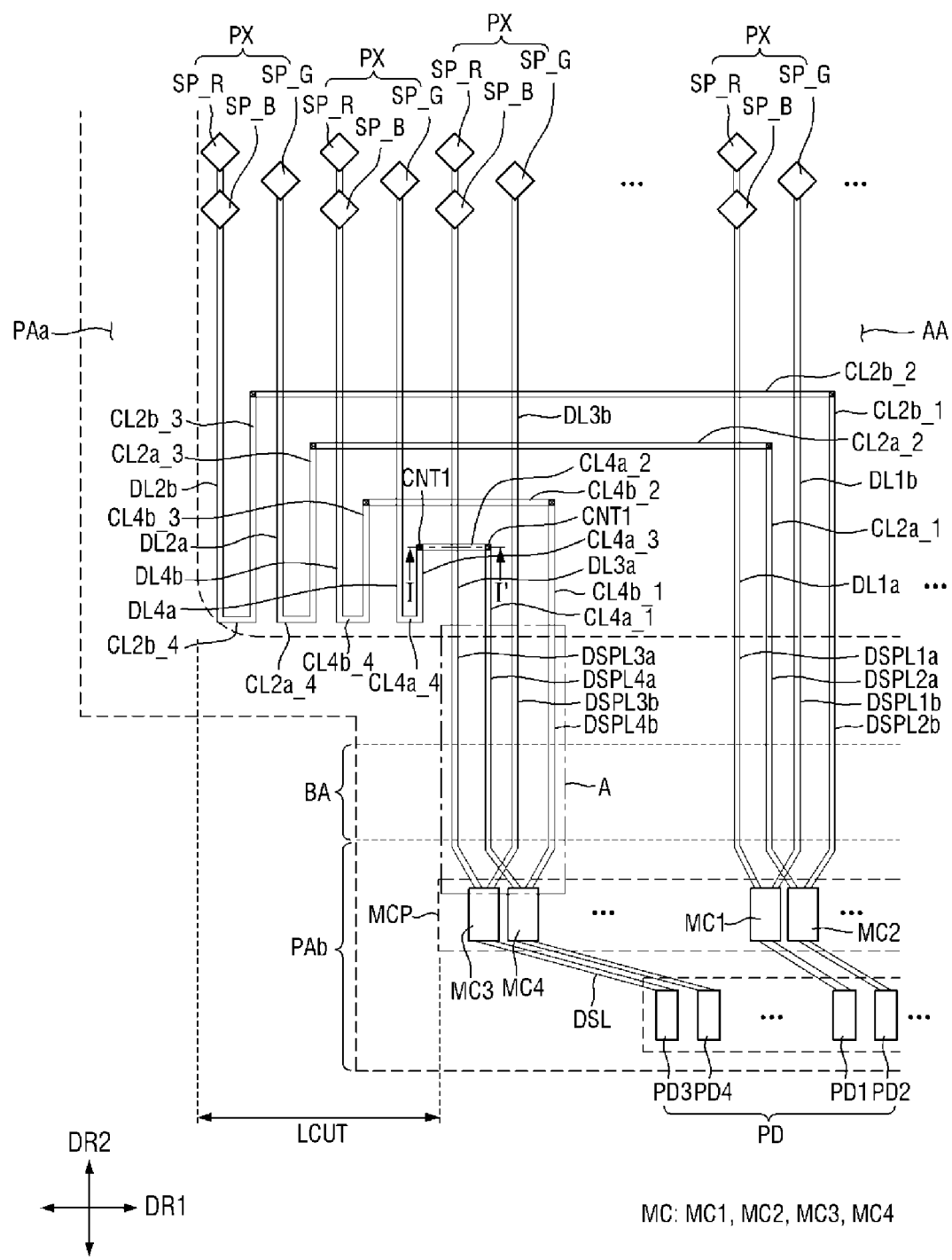
FIG. 13 is a plan view showing a part of a display area, a peripheral area, and a bending area of a display device according to another embodiment.

FIG. 12 is a block diagram showing an embodiment of pixels and a driving unit according to another embodiment. FIG. 13 is a plan view showing a part of a display area, a peripheral area, and a bending area of a display device according to another embodiment.

Referring to FIGS. 12 and 13, a display area AA of the display device according to the present embodiment has a different planar shape from that of the display area AA shown in FIGS. 2 and 7 in that it has a quadrangular shape on a plane defined by the first direction DR1 and the second direction DR2 perpendicular to the first direction DR1 and the corners of the display area AA are rounded.

In other words, the planar shape of the display area AA of the display device according to the present embodiment may be a quadrangular shape with rounded corners.

In the present embodiment, the length of the LCUT portion is equal to that in the display device of FIGS. 2 and 7, but the corner shape of the display area AA may be different. In this case, the length of the LCUT portion is not changed, but the number of the data lines DL connected to the spider line DSPL may be changed depending on the corner shape of the display area AA. In other words, the number of the data lines DL connected to the spider line DSPL through the connection line CL may be decreased as the curvature of the corner is decreased. On the other hand, the number of the data lines DL connected to the spider line DSPL through the connection line CL may be increased as the curvature of the corner is increased.

Figure 14:
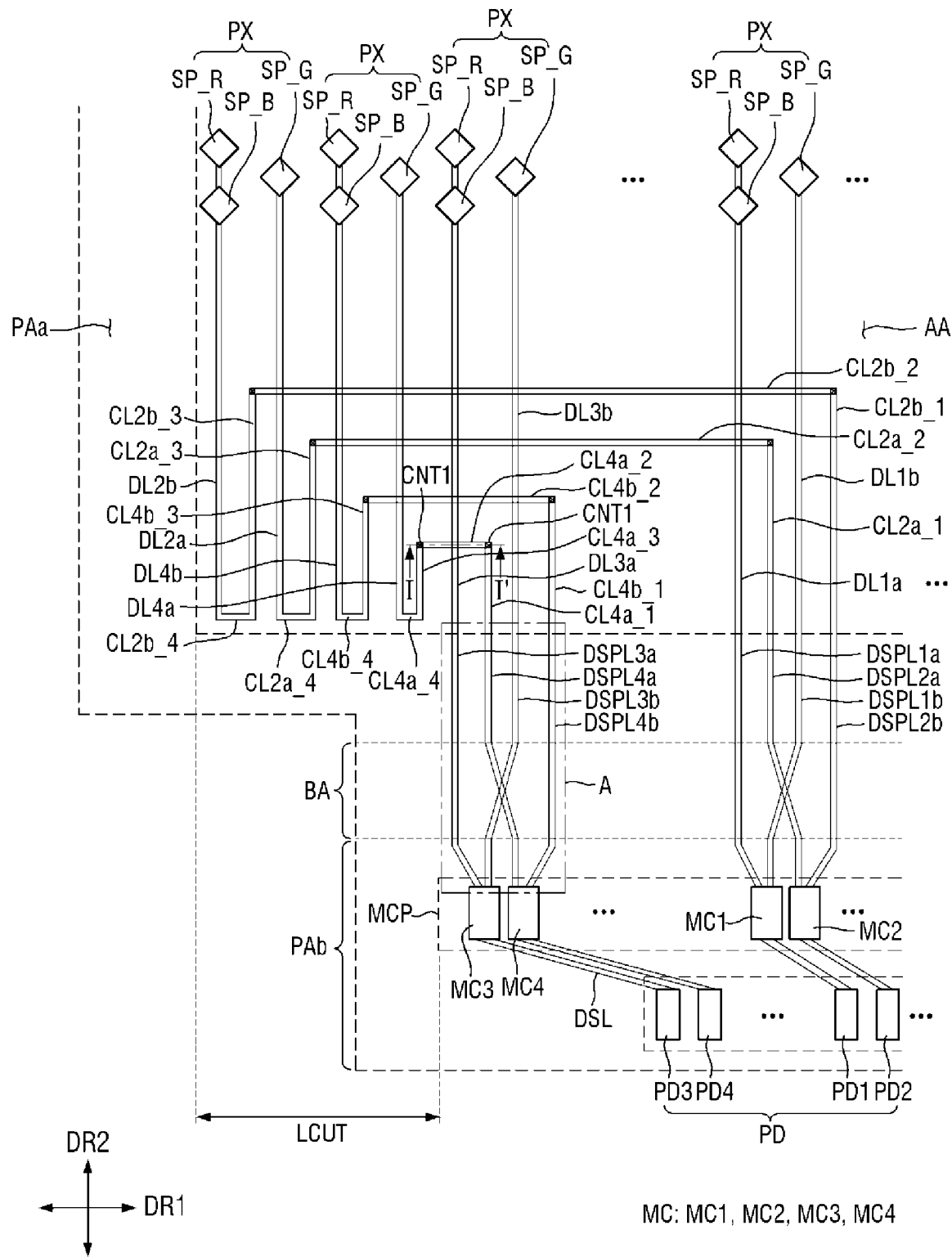
FIG. 14 is a plan view showing a part of a display area, a peripheral area, and a bending area of a display device according to still another embodiment.
Figure 15:
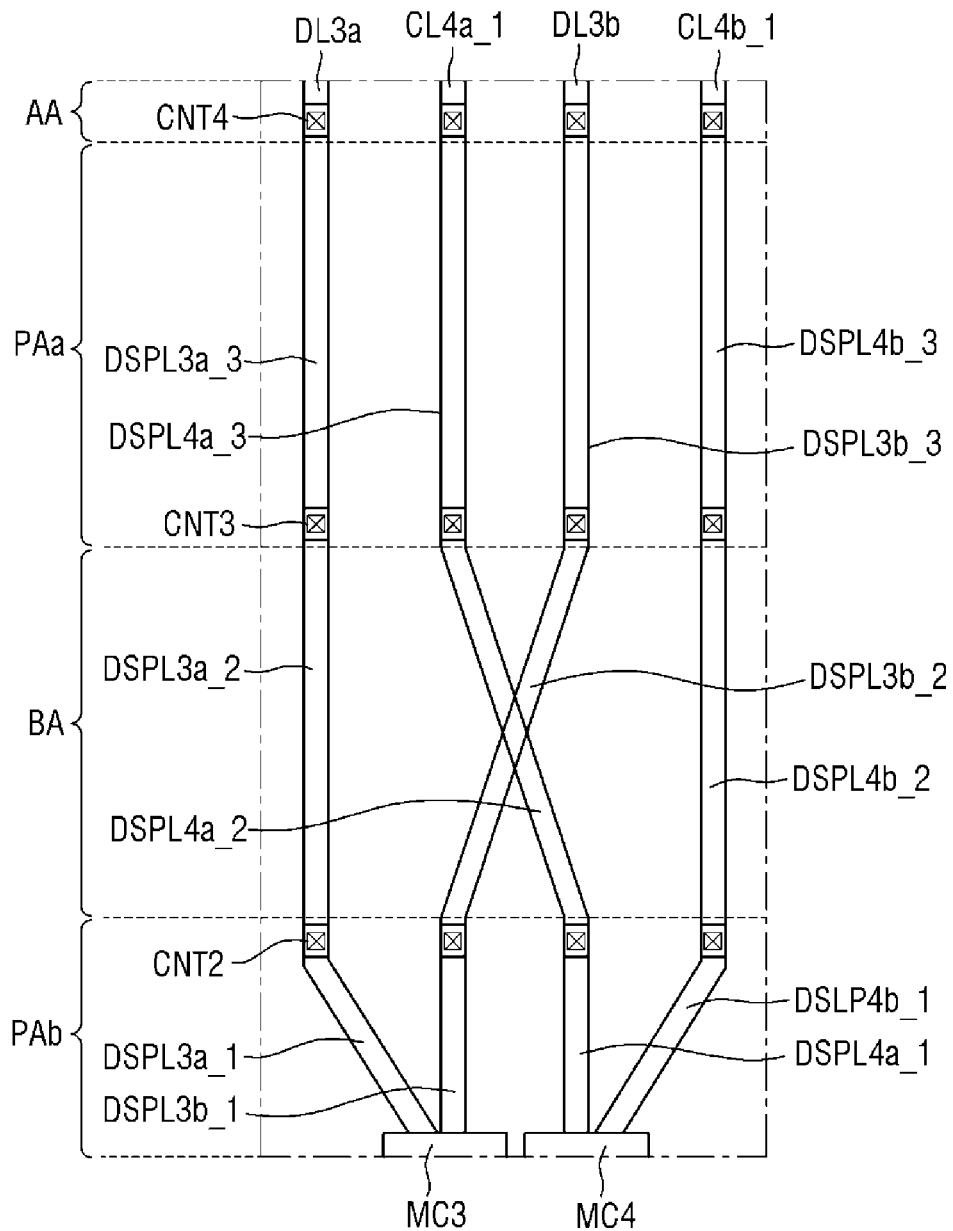
FIG. 15 is an enlarged plan view of area A of FIG. 14.

FIG. 14 is a plan view showing a part of a display area, a peripheral area, and a bending area of a display device according to still another embodiment. FIG. 15 is an enlarged plan view of area A of FIG. 14.

Referring to FIGS. 14 and 15, the display device according to the present embodiment is different from the display device of FIGS. 7 and 9 in that the spider lines DSPL4a_2 and DSPL3b_2 intersect (or overlap) in a plan view in the bending area BA.

As in the present embodiment, the spider lines DSPL4a_2 and DSPL3b_2 are located in different conductive layers and thus may be electrically insulated. However, in the bending area BA, the spider lines DSPL4a_2 and DSPL3b_2 may cross each other in a plan view.

Furthermore, the spider lines DSPL4a_1 and DSPL3b_1 may not intersect (or overlap) unlike the case shown in FIGS. 7 and 9.

Figure 16:
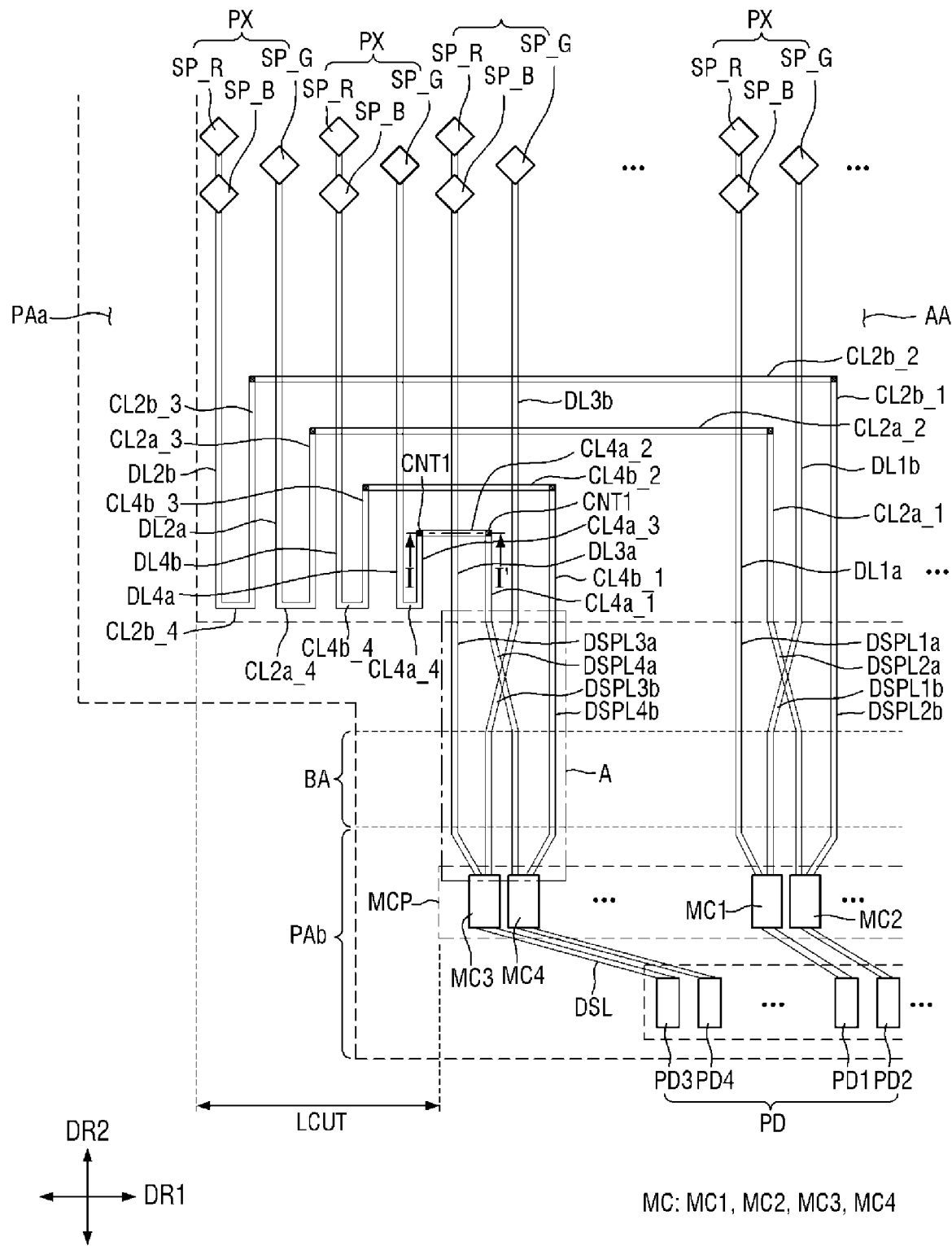
FIG. 16 is a plan view showing a part of a display area, a peripheral area, and a bending area of a display device according to still another embodiment.
Figure 17:
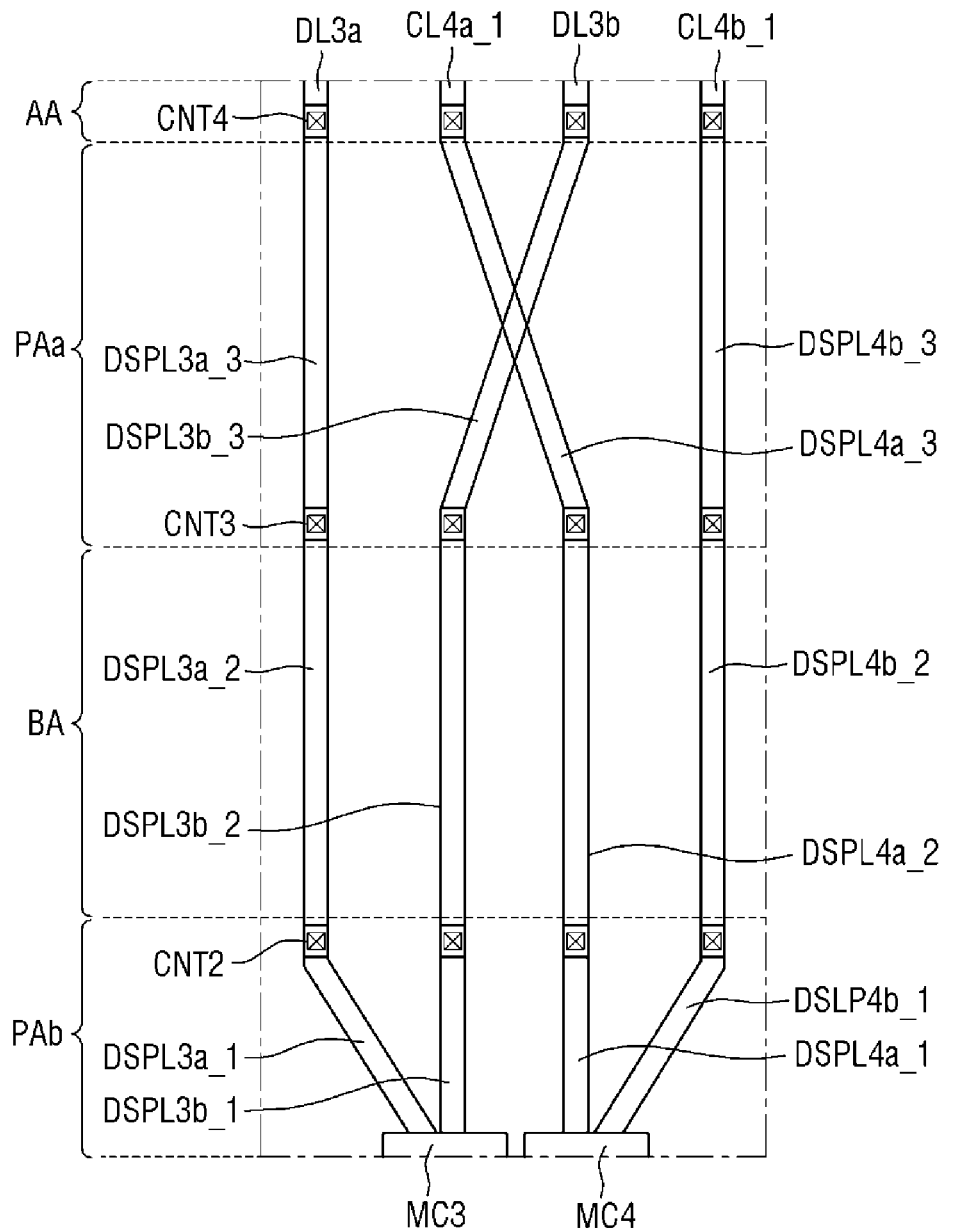
FIG. 17 is an enlarged plan view of area A of FIG. 16.

FIG. 16 is a plan view showing a part of a display area, a peripheral area, and a bending area of a display device according to still another embodiment. FIG. 17 is an enlarged plan view of area A of FIG. 16.

Referring to FIGS. 16 and 17, the display device according to the present embodiment is different from the display device shown in FIGS. 7 and 9 in that the spider lines DSPL4a_3 and DSPL3b_3 intersect (or overlap) in a plan view in the first peripheral area PAa.

As in the present embodiment, the spider lines DSPL4a_3 and DSPL3b_3 are located in different conductive layers and thus may be electrically insulated. However, in the first peripheral area PAa, the spider lines DSPL4a_3 and DSPL3b_3 may cross each other in a plan view.

Furthermore, the spider lines DSPL4a_1 and DSPL3b_1 may not intersect (or overlap) unlike the case shown in FIGS. 7 and 9.

Although embodiments of the disclosure have been disclosed for illustrative purposes, those skilled in the art will appreciate that various modifications, additions and substitutions are possible, without departing from the scope and spirit of the disclosure as disclosed in the accompanying claims.

What is claimed is:

1. A display device having a display area including a plurality of pixels arranged along a first direction and a second direction crossing the first direction, and a non-display area located around the display area, the non-display area including a first peripheral area surrounding the display area, a second peripheral area located at a lower side of the first peripheral area, and a bending area located between the first and second peripheral areas, the display device comprising:
    a base substrate;
    a multiplexer circuit unit disposed in the second peripheral area on the base substrate, the multiplexer circuit unit being spaced apart from the display area with respect to the bending area interposed therebetween;
    a plurality of spider lines including a first set of spider lines and a second set of spider lines, and connecting the multiplexer circuit unit to the plurality of pixels;
    a plurality of data lines connected to the plurality of pixels disposed in the display area on the base substrate and extending along the second direction, the plurality of data lines including a first set of data lines connected to the first set of spider lines directly and a second set of data lines connected to the second set of spider lines indirectly; and
    a plurality of connection lines connecting the second set of data lines to the second set of spider lines,
    wherein each of the plurality of connection lines includes a first portion extending along the first direction and a second portion extending along the second direction, and
    wherein the first portion of the plurality of connection lines is disposed on a different layer than the second portion of the plurality of connection lines.

2. The display device of claim 1, further comprising a data pad unit including a plurality of pads located at a lower side of the multiplexer circuit unit in the second peripheral area, configured to provide a data signal to the multiplexer circuit unit through a signal line, and arranged along the first direction.

3. The display device of claim 2, wherein the multiplexer circuit unit includes a plurality of multiplexer circuits, each of the plurality of multiplexer circuits includes two or more demultiplexer transistors, and
    the two or more demultiplexer transistors are electrically connected to a first demultiplexer select signal line, a second demultiplexer select signal line, or the signal line.

4. The display device of claim 3, wherein the plurality of connection lines include a 2a connection line and a 2b connection line.

5. The display device of claim 4, wherein the plurality of multiplexer circuits include a first multiplexer circuit and a second multiplexer circuit, and
    the plurality of spider lines include a 1a spider line and a 1b spider line connected to the first multiplexer circuit, and a 2a spider line and a 2b spider line connected to the second multiplexer circuit.

6. The display device of claim 5, wherein the plurality of data lines includes:
    a 1a data line directly connected to the 1a spider line;
    a 1b data line directly connected to the 1b spider line and adjacent to the 1a data line;
    a 2a data line connected to the 2a spider line through the 2a connection line; and
    a 2b data line connected to the 2b spider line through the 2b connection line.

7. The display device of claim 6, wherein each of the plurality of pixels includes a first sub-pixel, a second sub-pixel, and a third sub-pixel,
    the 1a data line is connected to the first sub-pixel and the second sub-pixel,
    the 1b data line is connected to the third sub-pixel,
    the 2a data line is connected to the third sub-pixel,
    the 2b data line is connected to the first sub-pixel and the second sub-pixel, and
    the first sub-pixel is a red pixel, the second sub-pixel is a blue pixel, and the third sub-pixel is a green pixel.

8. The display device of claim 6, wherein the 2a connection line includes:
    a 2a_1 connection line connected to the second multiplexer circuit and extending along the second direction;
    a 2a_2 connection line connected to the 2a_1 connection line and bent in the first direction from the 2a_1 connection line;
    a 2a_3 connection line connected to the 2a_2 connection line and bent in the second direction from the 2a_2 connection line; and
    a 2a_4 connection line connected to the 2a_3 connection line, bent in the first direction from the 2a_3 connection line, and connected to the 2a data line.

9. The display device of claim 8, wherein the 2a_2 connection line is located in a first conductive layer, and the 2a_1 connection line, the 2a_3 connection line, and the 2a_4 connection line are located in a second conductive layer different from the first conductive layer.

10. The display device of claim 9, wherein the 2a_2 connection line intersects in a plan view with the data line connected to multiplexer circuits other than the first multiplexer circuit and the second multiplexer circuit among the plurality of multiplexer circuits.

11. The display device of claim 9, wherein the 1b spider line and the 2a spider line intersect in a plan view.

12. The display device of claim 11, wherein the 1b spider line and the 2a spider line intersect in a plan view in the second peripheral area,
    the 1b spider line and the 2a spider line intersect in a plan view in the bending area, or the 1b spider line and the 2a spider line intersect in a plan view in the first peripheral area.

13. The display device of claim 11, wherein the 1b spider line includes:
    a 1b_1 spider line connected to the first multiplexer circuit and located in the second peripheral area;
    a 1b_2 spider line connected to the 1b_1 spider line and located in the bending area; and
    a 1b_3 spider line connected to the 1b_2 spider line and located in the first peripheral area, and wherein each of the 1b_1 spider line and the 1b_3 spider line is located in a different conductive layer from the 1b_2 spider line.

14. The display device of claim 13, wherein each of the 1b_1 spider line and the 1b_3 spider line is located in the first conductive layer, and
the 1b_2 spider line is located in the second conductive layer.

15. The display device of claim 14, wherein the 2a connection line includes:
a 2a_1 spider line connected to the second multiplexer circuit and located in the second peripheral area;
a 2a_2 spider line connected to the 2a_1 spider line and located in the bending area; and
a 2a_3 spider line connected to the 2a_2 spider line and located in the first peripheral area, and
wherein each of the 2a_1 spider line and the 2a_3 spider line is located in a different conductive layer from the 2a_2 spider line.

16. The display device of claim 15, wherein each of the 2a_1 spider line and the 2a_3 spider line is located in a third conductive layer, and the 2a_2 spider line is located in the second conductive layer.

17. A display device having a display area including a plurality of pixels and a non-display area located around the display area, the non-display area including a first peripheral area surrounding the display area, a second peripheral area located at a lower side of the first peripheral area, and a bending area located between the first and second peripheral areas, the display device comprising:
a base substrate;
a multiplexer circuit unit disposed in the second peripheral area on the base substrate;
a plurality of spider lines including a first set of spider lines and a second set of spider lines, and connecting the multiplexer circuit unit to the plurality of pixels; and
a plurality of data lines including a first set of data lines connected to the first set of spider lines directly and a second set of data lines connected to the second set of spider lines through a plurality of connection lines,
wherein the multiplexer circuit unit is spaced apart from the display area with respect to the bending area interposed therebetween,
the multiplexer circuit unit includes a plurality of multiplexer circuits,
the plurality of multiplexer circuits include a first multiplexer circuit and a second multiplexer circuit, the plurality of spider lines include a 1a spider line and a 1b spider line connected to the first multiplexer circuit, and a 2a spider line and a 2b spider line connected to the second multiplexer circuit, and
the 1b spider line and the 2a spider line intersect in a plan view and are insulated from each other,
wherein each of the plurality of connection lines includes a first portion extending along a first direction and a second portion extending along a second direction crossing the first direction, and
wherein the first portion of the plurality of connection lines is disposed on a different layer than the second portion of the plurality of connection lines.

18. The display device of claim 17, wherein the 1b spider line and the 2a spider line intersect in a plan view in the bending area, or
the 1b spider line and the 2a spider line intersect in a plan view in the first peripheral area.

19. The display device of claim 17, wherein the second peripheral area overlaps the first peripheral area in a thickness direction, and
the multiplexer circuit unit is disposed to overlap the first peripheral area.

20. A display device having a display area including a plurality of pixels and a non-display area located around the display area, the non-display area including a first peripheral area surrounding the display area, a second peripheral area located at a lower side of the first peripheral area, and a bending area located between the first and second peripheral areas, the display device comprising:
a base substrate; and
a multiplexer circuit unit disposed in the second peripheral area on the base substrate,
wherein the multiplexer circuit unit is spaced apart from the display area with respect to the bending area interposed therebetween,
a plurality of spider lines connected to the multiplexer circuit unit and the plurality of pixels,
the multiplexer circuit unit includes a plurality of multiplexer circuits,
the plurality of multiplexer circuits include a first multiplexer circuit and a second multiplexer circuit, the plurality of spider lines include a 1a spider line and a 1b spider line connected to the first multiplexer circuit, and a 2a spider line and a 2b spider line connected to the second multiplexer circuit, and
the 1b spider line and the 2a spider line intersect in a plan view and are insulated from each other,
wherein the 1b spider line and the 2a spider line intersect in a plan view in the bending area, or the 1b spider line and the 2a spider line intersect in a plan view in the first peripheral area,
wherein the 1b spider line includes:
a 1b_1 spider line connected to the first multiplexer circuit and located in the second peripheral area;
a 1b_2 spider line connected to the 1b_1 spider line and located in the bending area; and
a 1b_3 spider line connected to the 1b_2 spider line and located in the first peripheral area, and
wherein each of the 1b_1 spider line and the 1b_3 spider line is located in a different conductive layer from the 1b_2 spider line.

* * * * *